United States Patent
Chung et al.

(10) Patent No.: US 11,024,778 B2
(45) Date of Patent: Jun. 1, 2021

(54) LARGE SCALE FILM CONTAINING QUANTUM DOTS OR DYE, AND PRODUCTION METHOD THEREFOR

(71) Applicant: RESEARCH & BUSINESS FOUNDATION SUNGKYUNKWAN UNIVERSITY, Suwon-si (KR)

(72) Inventors: Ho Kyoon Chung, Yongin-si (KR); Hee Yeop Chae, Seoul (KR); Sung Min Cho, Gunpo-si (KR); Deok Su Jo, Suwon-si (KR); Subin Jung, Cheongju-si (KR); Bokyoung Kim, Suwon-si (KR); Dae Kyoung Kim, Seoul (KR); Seunghwan Lee, Pyeongtaek-si (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 0 days.

(21) Appl. No.: 15/735,312

(22) PCT Filed: Jun. 10, 2016

(86) PCT No.: PCT/KR2016/006221
§ 371 (c)(1),
(2) Date: Dec. 11, 2017

(87) PCT Pub. No.: WO2016/200225
PCT Pub. Date: Dec. 15, 2016

(65) Prior Publication Data
US 2018/0175254 A1  Jun. 21, 2018

(30) Foreign Application Priority Data

Jun. 10, 2015 (KR) .................. 10-2015-0081630

(51) Int. Cl.
*H01L 33/50* (2010.01)
*B32B 5/16* (2006.01)
(Continued)

(52) U.S. Cl.
CPC .............. *H01L 33/502* (2013.01); *B32B 5/16* (2013.01); *B32B 37/12* (2013.01); *G02B 6/02* (2013.01);
(Continued)

(58) Field of Classification Search
None
See application file for complete search history.

(56) References Cited

U.S. PATENT DOCUMENTS 3,622,419 A * 11/1971 London ................ H01L 23/16
156/293
8,865,489 B2 * 10/2014 Rogers .................. H01L 33/54
438/27
(Continued)

FOREIGN PATENT DOCUMENTS

KR    20070046784 A    5/2007
KR    20090091552 A    8/2009
(Continued)

OTHER PUBLICATIONS https://web.archive.org/web/20120321071058/http://www.compositesaustralia.com.au/about-composites-2/, Mar. 21, 2012 (Year: 2013).*
(Continued)

*Primary Examiner* — Vincent Wall
(74) *Attorney, Agent, or Firm* — NSIP Law

(57) ABSTRACT

The present disclosure relates to a large scale film containing quantum dots or a dye, a method of preparing the large scale film, including: forming quantum dots or a dye dispersed in a solvent in the form of fibers or beads; applying pressure to
(Continued)

an adhesive film to make the fibers or the beads adhere thereto; and curing the adhesive film onto which the fibers or the beads have adhered, and fibers or beads of quantum dots or a dye which are prepared by electrospinning.

18 Claims, 13 Drawing Sheets

(51) Int. Cl.
  *B32B 37/12* (2006.01)
  *G02B 6/02* (2006.01)
  *H01L 51/50* (2006.01)
  *H01L 51/00* (2006.01)

(52) U.S. Cl.
  CPC .......... *H01L 51/001* (2013.01); *H01L 51/502* (2013.01); *H01L 51/5036* (2013.01); *B32B 2264/10* (2013.01); *B32B 2457/206* (2013.01); *H01L 33/505* (2013.01); *H01L 2933/0041* (2013.01)

(56) References Cited

U.S. PATENT DOCUMENTS

| | | | | |
|---|---|---|---|---|
| 2002/0038999 | A1* | 4/2002 | Cao | H01L 27/3281 313/503 |
| 2009/0212695 | A1* | 8/2009 | Kim | H01L 51/5036 313/506 |
| 2009/0235986 | A1* | 9/2009 | Hotz | H01L 31/022425 136/260 |
| 2011/0068322 | A1* | 3/2011 | Pickett | C09K 11/02 257/13 |
| 2013/0000952 | A1* | 1/2013 | Srinivas | H01L 51/5206 174/126.1 |
| 2013/0056244 | A1* | 3/2013 | Srinivas | H05K 1/09 174/250 |
| 2013/0215599 | A1* | 8/2013 | Davis | F21V 7/0008 362/84 |
| 2014/0264196 | A1* | 9/2014 | Werner | C23C 16/30 252/519.34 |

FOREIGN PATENT DOCUMENTS

| | | |
|---|---|---|
| KR | 20110099475 A | 9/2011 |
| KR | 101184434 B1 | 9/2012 |
| KR | 20130089295 A | 8/2013 |
| KR | 20140114163 A | 9/2014 |
| KR | 20150025651 A | 3/2015 |
| KR | 20150034013 A | 4/2015 |

OTHER PUBLICATIONS

International Search Report for International Application No. PCT/KR2016/006221 (2 Pages) (dated Aug. 30, 2016).

\* cited by examiner

LARGE SCALE FILM CONTAINING QUANTUM DOTS OR DYE, AND PRODUCTION METHOD THEREFOR

CROSS-REFERENCE TO RELATED APPLICATIONS

This application is a 371 of PCT/KR2016/006221, filed on Jun. 10, 2016, which claims the benefit of Korean Patent Application No. 10-2015-0081630 filed Jun. 10, 2015, the contents of each of which are incorporated herein by reference.

FIELD OF THE INVENTION

The present disclosure relates to a large scale film containing fibers or beads of quantum dots or a dye, a method of preparing the large scale film, and fibers or beads of quantum dots or a dye which are prepared by electrospinning.

BACKGROUND OF THE INVENTION

Quantum dots refer to a technology of controlling an intrinsic band gap of an element by controlling a nano-scale crystal size when a crystal size of semiconductor elements formed by $sp^3$ hybrid bonds is smaller than a band gap of an element. Further, due to strong covalent binding of quantum dots, it is possible to obtain high-purity light emission with a narrow half width. This is expected to highly contribute to the advance in color reproduction range of next-generation display.

Conventionally, casting, spin coating, doctor blade, painting, and spray coating have been used to form a large scale film of quantum dots, but these methods need to have additional functions such as uniform dispersion of the quantum dots, barrier, and light diffusion. This problem may have a bad effect on a lifetime, light efficiency and light conversion efficiency of the quantum dot film, and with the progress of additional processes, the thickness of the quantum dot film is increased.

A quantum dot film prepared by electrospinning improves the light efficiency and the light conversion efficiency by promoting uniform dispersion of quantum dots and internal reflection. However, it has been difficult to commercialize quantum dots due to low productivity and limitations of a small scale film.

In this regard, Korean Patent Laid-open Publication No. 2015-0025651 entitled "Quantum dot film and display device including the same" discloses a method of forming a thin film by coating a quantum dot solution on a transparent substrate via spin coating, sol-gel reaction, dip-coating, metal-organic chemical vapor deposition, and the like.

SUMMARY OF THE INVENTION

The present disclosure relates to a large scale film containing quantum dots or a dye and a method of preparing the large scale film, and specifically, the present disclosure relates to a large scale film in which quantum dots or a dye is not agglomerated but uniformly dispersed, a method of preparing the large scale film, and fibers or beads of quantum dots or a dye which are prepared by electrospinning. However, problems to be solved by the present disclosure are not limited to the above-described problems. Although not described herein, other problems to be solved by the present disclosure can be clearly understood by those skilled in the art from the following descriptions.

A first aspect of the present disclosure provides a method of preparing a large scale film, including forming quantum dots or a dye dispersed in a solvent in the form of fibers or beads; applying pressure to an adhesive film to make the fibers or the beads adhere thereto; and curing the adhesive film onto which the fibers or the beads have adhered.

A second aspect of the present disclosure provides a large scale film including fibers or beads of quantum dots or a dye adhering onto an adhesive film.

A third aspect of the present disclosure provides fibers or beads of quantum dots or a dye which are prepared by electrospinning.

A fourth aspect of the present disclosure provides a light emitting diode including the large scale film according to the second aspect of the present disclosure, containing fibers or beads of quantum dots or a dye adhering onto an adhesive film.

A method of preparing a large scale film according to an exemplary embodiment of the present disclosure provides a method of preparing a large scale film by forming quantum dots or a dye included in a solvent in the form of fibers or beads via electrospinning and applying the fibers or the beads of the quantum dots or the dye on an adhesive film with a predetermined pressure via solvent-free bonding.

In a quantum dot film according to an exemplary embodiment of the present disclosure, quantum dots are solidified in a moment by electrospinning, and, thus, the light efficiency of the quantum dots or a dye can be increased, and the quantum dots or the dye is formed into fibers or beads to induce back reflection of light, and, thus, the light conversion efficiency can be increased. Further, in the case where the quantum dots have a core-shell structure, quantum dot fibers or quantum dot beads having a core-shell structure can be prepared, and the shell may have a function to control a barrier property and a refractive index.

A large scale film according to an exemplary embodiment of the present disclosure can be applied to a light emitting diode (LED), an organic light emitting diode (OLED), a backlight unit, solar energy generation, marine operations, and a plant factory.

DETAILED DESCRIPTION OF THE INVENTION

Figure 1:
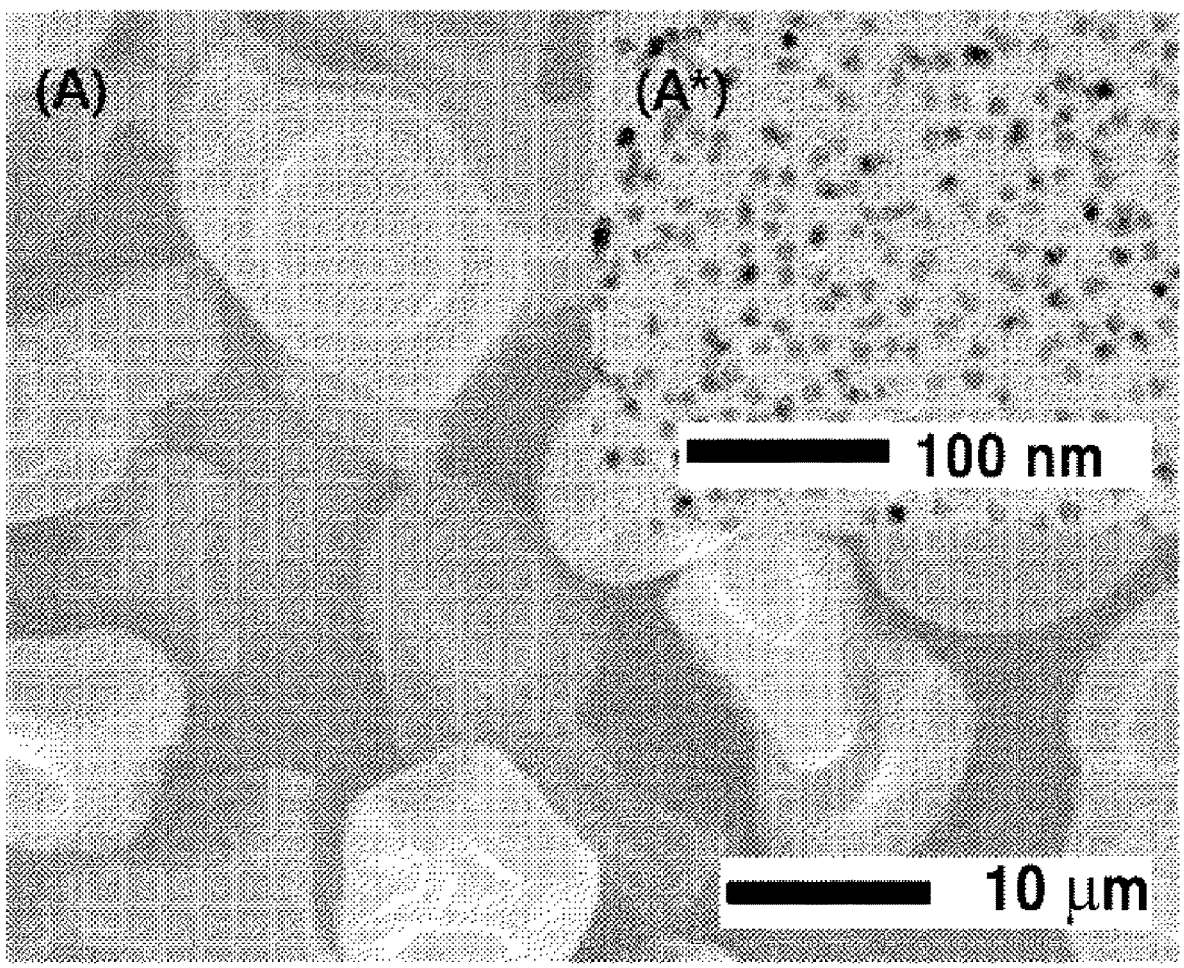
FIG. 1 provides a FE-SEM image of red quantum dot beads and a TEM image (inset) of a single quantum dot bead according to an example of the present disclosure.

Hereinafter, examples of the present disclosure will be described in detail with reference to the accompanying drawings so that the present disclosure may be readily implemented by those skilled in the art. However, it is to be noted that the present disclosure is not limited to the examples but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the other element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination(s) of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Through the whole document, the term "electrospinning" refers to a method of implementing randomly arranged continuous fibers having a diameter of from micrometer to nanometer scale by jetting electrically charged polymer solution and melt, and this method is simpler than the known methods such as self-assembly, phase separation, template synthesis, and the like and can be used for all of polymer materials which can be molten and mixed in a solvent to easily prepare nanofibers, and this method can also be used for medical engineering/industrial application on the basis of high specific surface area and porosity caused by a shape and various properties caused by easiness in controlling a structure/size.

Hereinafter, embodiments and examples of the present disclosure will be described in detail with reference to the accompanying drawings. However, the present disclosure may not be limited to the following embodiments, examples and drawings.

A first aspect of the present disclosure provides a method of preparing a large scale film, including forming quantum dots or a dye dispersed in a solvent in the form of fibers or beads; applying pressure to an adhesive film to make the fibers or the beads adhere thereto; and curing the adhesive film onto which the fibers or the beads have adhered.

In an exemplary embodiment of the present disclosure, the large scale film contains quantum dots or a dye, and the quantum dots or the dye is uniformly dispersed in the large scale film.

In an exemplary embodiment of the present disclosure, the forming of the fibers or the beads is performed by electrospinning, but may not be limited thereto.

In a quantum dot film according to an exemplary embodiment of the present disclosure, quantum dots are solidified in a moment by the electrospinning, and, thus, the light efficiency of the quantum dots or the dye can be increased, and the quantum dots or the dye is formed into fibers or beads to induce back reflection of light, and, thus, the light conversion efficiency can be increased. Further, in the case where the quantum dots have a core-shell structure, quantum dot fibers or quantum dot beads having a core-shell structure can be prepared, and the shell may have a function to control a barrier property and a refractive index.

In an exemplary embodiment of the present disclosure, the quantum dot fibers prepared by the electrospinning may be obtained in bulk, but may not be limited thereto. The quantum dot fibers in bulk are prepared in bulk by the electrospinning, and, thus, it is easy to mass-produce the quantum dot fibers.

In an exemplary embodiment of the present disclosure, the quantum dots or the dye is prepared in the form of the fibers or the beads, and, thus, quantum dot or dye particles which can be easily agglomerated are dispersed well and bonded to the adhesive film to a uniform thickness without agglomeration.

In an exemplary embodiment of the present disclosure, the method may further include treating surfaces of the fibers or the beads by atomic layer deposition (ALD) after the forming of the fibers or the beads, but may not be limited thereto. The fibers or the beads can be safely encapsulated against heat and moisture by the ALD.

In an exemplary embodiment of the present disclosure, a process for the ALD may be divided into organic-inorganic coating processes, and may inorganic coating or organic-inorganic coating may be performed about 1 time to about 10 times, but may not be limited thereto. The ALD may be performed using the following method, but may not be limited thereto.

In a first process for the ALD, quantum dot fibers or beads are exposed to a metal precursor.

In a second process for the ALD, an ALD chamber including the quantum dot fibers or beads of the first process is purged to remove an unreacted metal precursor, a gas, and by-products.

In a third process of the ALD, the quantum dot fibers or beads of the first process are exposed to an oxide precursor.

In a fourth process for the ALD, an unreacted oxide precursor, a gas, and by-products are removed.

In an exemplary embodiment of the present disclosure, in the processes for the ALD, an internal temperature of the ALD chamber, a capacity of the chamber, a carrier flow rate, a purging time, or a precursor injection time can be controlled to an optimum state for reactions of the precursors. In the above-described processes, the coating may be performed to an atomic thickness of from about 0.1 Å to about 1 Å, or by increasing a time or cycle of the above-described processes, a metal oxide may be coated to a thickness of from about 1 nm to about 100 nm on the fibers or the beads.

In an exemplary embodiment of the present disclosure, the oxide precursor may include ozone, water, alcohols, or hydrogen peroxide, but may not be limited thereto.

In an exemplary embodiment of the present disclosure, molecular layer deposition (MLD) for forming a buffer layer between a fiber-encapsulation layer and a bead-encapsulation layer or between a fiber-encapsulation layer-encapsulation layer and a bead-encapsulation layer-encapsulation layer may be added through additional coating of an organic layer on the fibers or the beads of the quantum dots or the dye coated with the metal oxide through the ALD, and the MLD uses a metal oxide precursor unlike the ALD and is performed in the same ALD chamber. Further, an organic layer formed as the buffer layer may supply a group with a hydrophilic surface such as an —OH functional group.

In an exemplary embodiment of the present disclosure, quantum dot particles vulnerable to heat and moisture penetration can be protected by performing the ALD to the fibers or the beads. Further, an encapsulation structure is formed as an inorganic-organic-inorganic pair by performing ALD to the inorganic layer and MLD to the organic layer, and, thus, it is possible to effectively secure the stability against heat and moisture penetration.

In an exemplary embodiment of the present disclosure, the metal oxide coated on the fibers or the beads of the quantum dots or the dye by the ALD may include an inorganic material selected from the group consisting of $Al_2O_3$, $SiO_2$, $ZnO$, $ZrO_2$, $TiO_2$, $HfO_2$, $Ta_2O_5$, and combinations thereof, but may not be limited thereto.

In an exemplary embodiment of the present disclosure, an organic material functioning as a buffer layer between a fiber-inorganic material or a bead-inorganic material of the ALD-treated quantum dots or dye may be coated by the ALD, and the organic material may include a member selected from the group consisting of vinyl alcohol, ethylene vinyl alcohol, methacrylate, poloxamer, polyether, polymethyl vinyl ether, polyepoxy succinic acid, polyethylene glycol, polythioether (e.g., polythiophene, poly(3,4-ethylenedioxythiophene)), polythiol, polyvinyl acid, polyvinyl phosphonic acid, polyvinyl sulfuric acid, polyamide (e.g., polyacrylamide), polyethyloxazoline, polyester, fumed silica, and combinations thereof, and preferably, the organic material may include may include ethylene glycol, polyether, polythiol, poly carbonyl, poly ether, poly ester, or polytrimethacrylate, but may not be limited thereto.

In an exemplary embodiment of the present disclosure, a temperature of the ALD chamber may be from about 50° C. to about 300° C., but may not be limited thereto. For example, a temperature of the ALD chamber may be from about 50° C. to about 300° C., from about 50° C. to about 250° C., from about 50° C. to about 200° C., from about 50° C. to about 150° C., or from about 50° C. to about 100° C., but may not be limited thereto.

In an exemplary embodiment of the present disclosure, a flow rate of the inert gas or the pulse gas may be in the range of from 200 sccm to about 10,000 sccm and preferably from about 300 to about 5,000 sccm on the basis of the ALD chamber of about 500 mL, but may not be limited thereto. This is because a flow rate of the gas to be injected varies depending on a capacity or length of the ALD chamber, or the amount of the injected precursor.

In an exemplary embodiment of the present disclosure, a reaction time of the precursor may be from about 0.1 second to about 60 seconds and preferably from about 0.5 seconds to about 30 seconds, but may not be limited thereto. This is because a reaction time varies depending on a capacity or length of the ALD chamber, or the amount of the injected precursor.

In an exemplary embodiment of the present disclosure, the fibers or the beads may include quantum dot fibers, quantum dot fibers having a core-shell structure, quantum dot beads, quantum dot beads having a core-shell structure, dye fibers, or dye beads, but may not be limited thereto.

In an exemplary embodiment of the present disclosure, the width of the fiber of the quantum dots or the dye may be from 50 nm to 20 μm, but may not be limited thereto. For example, the width of the quantum dot fiber may be from about 50 nm to about 20 μm, from about 50 nm to about 10 μm, from about 50 nm to about 1 μm, from about 50 nm to about 500 nm, from about 50 nm to about 100 nm, from about 100 nm to about 20 μm, from about 500 nm to about 20 μm, from about 1 μm to about 20 μm, or from about 10 μm to about 20 μm, but may not be limited thereto.

In an exemplary embodiment of the present disclosure, the length of the quantum dot fiber may be about 5 times to about $10^{10}$ times greater than the width of the quantum dot fiber, but may not be limited thereto. For example, if the width of the fiber of the quantum dots or the dye is about 50 nm, the length may be about 5 times, about 10 times, about $10^2$ times, about $10^3$ times, about $10^4$ times, about $10^5$ times, about $10^6$ times, about $10^7$ times, about $10^8$ times, about $10^9$ times, or about $10^{10}$ times greater than the width, and if the width of the quantum dot fiber is from about 100 nm to about 20 µm, the length may be about 5 times to about $10^5$ times greater than the width, but may not be limited thereto.

In an exemplary embodiment of the present disclosure, the size of the bead of the quantum dots or the dye may be from about 50 nm to about 20 µm, but may not be limited thereto. For example, the size of the bead of the quantum dots or the dye may be from about 50 nm to about 20 µm, from about 50 nm to about 10 µm, from about 50 nm to about 1 µm, from about 50 nm to about 500 nm, from about 50 nm to about 100 nm, from about 100 nm to about 20 µm, from about 500 nm to about 20 µm, from about 1 µm to about 20 µm, or from about 10 µm to about 20 µm, but may not be limited thereto.

In an exemplary embodiment of the present disclosure, the thickness and material of the quantum dot fiber may induce light scattering and light reflection by controlling λ/4 and a reflective index, but may not be limited thereto.

In an exemplary embodiment of the present disclosure, the method may further include a process of grinding the fibers after forming of the fibers of the quantum dots or the dye, but may not be limited thereto. For example, the grinding process may be performed by any one of apparatuses such as a dry-type homogenizer, e.g., a ball mill, a roller mill, a vibration ball mill, an autolite mill, a planetary ball mill, a sand mill, a cutter mill, a hammer mill, or a jet mill), and the like, an dry homogenizer, an ultrasonic homogenizer, or a high-pressure homogenizer, but may not be limited thereto. The fibers of the quantum dots or the dye can be atomized into powder through the grinding process.

In an exemplary embodiment of the present disclosure, the quantum dots may include core-shell quantum dots, but may not be limited thereto.

In an exemplary embodiment of the present disclosure, a core material of the core-shell quantum dots may include a member selected from the group consisting of Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdSeZn, CdTe, $Cd_3P_2$, $Cd_3As_2$, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $CuInS_2$, $CuInSe_2$, $Cu_2ZnSnSe_4$, $AgIn_5S_8$, $Si_3N_4$, $Ge_3N_4$, $Al_2O_3$, $(Al, Ga, In)_2(S, Se, Te)_3$, and combinations thereof and preferably may include CdSe, InP, CdTe, $AgIn_5S_8$, Si, or C, but may not be limited thereto.

In an exemplary embodiment of the present disclosure, a shell of the core-shell quantum dots may include a member selected from the group consisting of CdS, CdS/ZnS, ZnS, ZnS/ZnS, ZnCdS, CdS, ZnS, ZnS, ZnSe/ZnS, CdS/CdS, PbS, ZnS, $SiO_2$, and combinations thereof and preferably may include ZnS, CdS, ZnCdS, or $SiO_2$, but may not be limited thereto.

In an exemplary embodiment of the present disclosure, a ligand of the core-shell quantum dots may include a member selected from the group consisting of glassy polymer-based, silicone-based, carboxylic acid-based, dicarboxylic acid-based, polycarboxylic acid-based, acrylic acid-based, phosphonic acid-based, phosphonate-based, phosphine-based, phosphine oxide-based, sulfide-based, amine-based, epoxide-based, amide-based, amine-based ligands, and combinations thereof and preferably may include an amine-based or amide-based ligand, but may not be limited thereto.

In an exemplary embodiment of the present disclosure, the dye may include a member selected from the group consisting of rhodamine-based, coumarin-based, acridine-based, fluorescein-based, erythrosine-based, anthraquinone-based, arylmethane-based, AZO-based, diazonium-based, nitro-based, nitroso-based, phthalocyanine-based, quinone-imine-based, thiazole-based, safranin-based, xanthene-based dyes, and combinations thereof and preferably may include a rhodamine-based dye, but may not be limited thereto.

In an exemplary embodiment of the present disclosure, the solvent may include an organic solvent in which a polymer is dispersed, but may not be limited thereto. For example, the polymer and the organic solvent may be mixed at a ratio of about 1:9, but may not be limited thereto.

In an exemplary embodiment of the present disclosure, the organic solvent may include a member selected from the group consisting of chloroform, toluene, benzene, dimethylformamide, dimethylacetamide, dimethylsulfoxide, tetrahydrofuran, and combinations thereof, but may not be limited thereto.

In an exemplary embodiment of the present disclosure, the polymer may include a member selected from the group consisting of polystyrene (PS), polymethyl methacrylate (PMMA), polyamide, poly(butyl methacrylate) (PBMA), polyvinylidene fluoride (PVDF), polyvinylidene fluoride-hexafluoropropylene (PVDF-HFP), polyethylene oxide (PEO), polyphenylene oxide (PPO), and combinations thereof, but may not be limited thereto.

In an exemplary embodiment of the present disclosure, the fibers or the beads may be mixed as a solute in an adhesive material solvent to form a quantum dot film, but may not be limited thereto.

In an exemplary embodiment of the present disclosure, the quantum dot film mixed as a solute in the adhesive material solvent may be formed by casting, spin coating, doctor blade, painting, or spray coating, but may not be limited thereto.

In an exemplary embodiment of the present disclosure, the adhesive material may include a member selected from the group consisting of optically clean adhesive (OCA), optically clean resin (OCR), polyimide, polyethylene terephthalate, polycarbonate, silicone, and combinations thereof, but may not be limited thereto.

In an exemplary embodiment of the present disclosure, the method of preparing a quantum dot film may further include a roll-to-roll process or a sheet-to-sheet process, but may not be limited thereto.

A second aspect of the present disclosure provides a large scale film including fibers or beads of quantum dots or a dye adhering onto an adhesive film.

In an exemplary embodiment of the present disclosure, the large scale film is prepared by forming the quantum dots or the dye included in a solvent in the form of the fibers or the beads via electrospinning and applying the fibers or the beads of the quantum dots or the dye on an adhesive film with a predetermined pressure via solvent-free bonding.

In an exemplary embodiment of the present disclosure, the large scale film contains the fibers or the beads of the quantum dots or the dye prepared by electrospinning, and, thus, the quantum dots or the dye is uniformly dispersed in the large scale film.

In an exemplary embodiment of the present disclosure, the fibers or the beads may include quantum dot fibers, quantum dot fibers having a core-shell structure, quantum dot beads, quantum dot beads having a core-shell structure, dye fibers, or dye beads, but may not be limited thereto.

In an exemplary embodiment of the present disclosure, the width of the fiber of the quantum dots or the dye may be from 50 nm to 20 µm, but may not be limited thereto. For example, the width of the quantum dot fiber may be from about 50 nm to about 20 µm, from about 50 nm to about 10

μm, from about 50 nm to about 1 μm, from about 50 nm to about 500 nm, from about 50 nm to about 100 nm, from about 100 nm to about 20 μm, from about 500 nm to about 20 μm, from about 1 μm to about 20 μm, or from about 10 μm to about 20 μm, but may not be limited thereto.

In an exemplary embodiment of the present disclosure, the length of the quantum dot fiber may be about 5 times to about $10^{10}$ times greater than the width of the quantum dot fiber, but may not be limited thereto. For example, if the width of the fiber of the quantum dots or the dye is about 50 nm, the length may be about 5 times, about 10 times, about $10^2$ times, about $10^3$ times, about $10^4$ times, about $10^5$ times, about $10^6$ times, about $10^7$ times, about $10^8$ times, about $10^9$ times, or about $10^{10}$ times greater than the width, and if the width of the quantum dot fiber is from about 100 nm to about 20 μm, the length may be about 5 times to about $10^5$ times greater than the width, but may not be limited thereto.

In an exemplary embodiment of the present disclosure, the size of the bead of the quantum dots or the dye may be from about 50 nm to about 20 μm, but may not be limited thereto. For example, the size of the bead of the quantum dots or the dye may be from about 50 nm to about 20 μm, from about 50 nm to about 10 μm, from about 50 nm to about 1 μm, from about 50 nm to about 500 nm, from about 50 nm to about 100 nm, from about 100 nm to about 20 μm, from about 500 nm to about 20 μm, from about 1 μm to about 20 μm, or from about 10 μm to about 20 μm, but may not be limited thereto.

In an exemplary embodiment of the present disclosure, the adhesive film may include a member selected from the group consisting of optically clean adhesive (OCA), optically clean resin (OCR), polyimide, polyethylene terephthalate, polycarbonate, silicone, and combinations thereof, but may not be limited thereto.

In an exemplary embodiment of the present disclosure, surfaces of the fibers or the beads of the quantum dots or the dye may be treated by ALD. A buffer layer may be formed between a fiber-encapsulation layer and a bead-encapsulation layer or between a fiber-encapsulation layer-encapsulation layer and a bead-encapsulation layer-encapsulation layer through additional coating of an organic layer on the fibers or the beads of the quantum dots or the dye coated with the metal oxide through the ALD. An organic layer formed as the buffer layer may supply a group with a hydrophilic surface such as an —OH functional group.

In an exemplary embodiment of the present disclosure, quantum dot particles vulnerable to heat and moisture penetration can be protected by performing the ALD to the fibers or the beads. Further, an encapsulation structure is formed as an inorganic-organic-inorganic pair by performing ALD to the inorganic layer and MLD to the organic layer, and, thus, it is possible to effectively secure the stability against heat and moisture penetration.

In an exemplary embodiment of the present disclosure, the metal oxide coated on the fibers or the beads of the quantum dots or the dye by the ALD may include an inorganic material selected from the group consisting of $Al_2O_3$, $SiO_2$, ZnO, $ZrO_2$, $TiO_2$, $HfO_2$, $Ta_2O_5$, and combinations thereof, but may not be limited thereto.

In an exemplary embodiment of the present disclosure, an organic material functioning as a buffer layer between a fiber-inorganic material or a bead-inorganic material of the ALD-treated quantum dots or dye may be coated by the ALD, and the organic material may include a member selected from the group consisting of vinyl alcohol, ethylene vinyl alcohol, methacrylate, poloxamer, polyether, polymethyl vinyl ether, polyepoxy succinic acid, polyethylene glycol, polythioether (e.g., polythiophene, poly(3,4-ethylenedioxythiophene)), polythiol, polyvinyl acid, polyvinyl phosphonic acid, polyvinyl sulfuric acid, polyamide (e.g., polyacrylamide), polyethyloxazoline, polyester, fumed silica, and combinations thereof, and preferably, the organic material may include may include ethylene glycol, polyether, polythiol, poly carbonyl, poly ether, poly ester, or polytrimethacrylate, but may not be limited thereto.

In an exemplary embodiment of the present disclosure, the quantum dots may include core-shell quantum dots, but may not be limited thereto.

In an exemplary embodiment of the present disclosure, a core material of the core-shell quantum dots may include a member selected from the group consisting of Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdSeZn, CdTe, $Cd_3P_2$, $Cd_3As_2$, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $CuInS_2$, $CuInSe_2$, $Cu_2ZnSnSe_4$, $AgIn_5S_8$, $Si_3N_4$, $Ge_3N_4$, $Al_2O_3$, $(Al, Ga, In)_2(S, Se, Te)_3$, and combinations thereof and preferably may include CdSe, InP, CdTe, $AgIn_5S_8$, Si, or C, but may not be limited thereto.

In an exemplary embodiment of the present disclosure, a shell of the core-shell quantum dots may include a member selected from the group consisting of CdS, CdS/ZnS, ZnS, ZnS/ZnS, ZnCdS, CdS, ZnS, ZnS, ZnSe/ZnS, CdS/CdS, PbS, ZnS, $SiO_2$, and combinations thereof and preferably may include ZnS, CdS, ZnCdS, or $SiO_2$, but may not be limited thereto.

In an exemplary embodiment of the present disclosure, a ligand of the core-shell quantum dots may include a member selected from the group consisting of glassy polymer-based, silicone-based, carboxylic acid-based, dicarboxylic acid-based, polycarboxylic acid-based, acrylic acid-based, phosphonic acid-based, phosphonate-based, phosphine-based, phosphine oxide-based, sulfide-based, amine-based, epoxide-based, amide-based, amine-based ligands, and combinations thereof and preferably may include an amine-based or amide-based ligand, but may not be limited thereto.

In an exemplary embodiment of the present disclosure, the dye may include a member selected from the group consisting of rhodamine-based, coumarin-based, acridine-based, fluorescein-based, erythrosine-based, anthraquinone-based, arylmethane-based, AZO-based, diazonium-based, nitro-based, nitroso-based, phthalocyanine-based, quinone-imine-based, thiazole-based, safranin-based, xanthene-based dyes, and combinations thereof and preferably may include a rhodamine-based dye, but may not be limited thereto.

A third aspect of the present disclosure provides fibers or beads of quantum dots or a dye which are prepared by electrospinning.

In an exemplary embodiment of the present disclosure, the fibers or the beads of the quantum dots or the dye are prepared by electrospinning, and, thus, the quantum dots or the dye is uniformly dispersed.

In an exemplary embodiment of the present disclosure, the fibers or the beads may include quantum dot fibers, quantum dot fibers having a core-shell structure, quantum dot beads, quantum dot beads having a core-shell structure, dye fibers, or dye beads, but may not be limited thereto.

In an exemplary embodiment of the present disclosure, the width of the fiber of the quantum dots or the dye may be from 50 nm to 20 μm, but may not be limited thereto. For example, the width of the quantum dot fiber may be from about 50 nm to about 20 µm, from about 50 nm to about 10 µm, from about 50 nm to about 1 µm, from about 50 nm to about 500 nm, from about 50 nm to about 100 nm, from about 100 nm to about 20 µm, from about 500 nm to about 20 µm, from about 1 µm to about 20 µm, or from about 10 µm to about 20 µm, but may not be limited thereto.

In an exemplary embodiment of the present disclosure, the length of the quantum dot fiber may be about 5 times to about $10^{10}$ times greater than the width of the quantum dot fiber, but may not be limited thereto. For example, if the width of the fiber of the quantum dots or the dye is about 50 nm, the length may be about 5 times, about 10 times, about $10^2$ times, about $10^3$ times, about $10^4$ times, about $10^5$ times, about $10^6$ times, about $10^7$ times, about $10^8$ times, about $10^9$ times, or about $10^{10}$ times greater than the width, and if the width of the quantum dot fiber is from about 100 nm to about 20 µm, the length may be about 5 times to about $10^5$ times greater than the width, but may not be limited thereto.

In an exemplary embodiment of the present disclosure, the size of the bead of the quantum dots or the dye may be from about 50 nm to about 20 µm, but may not be limited thereto. For example, the size of the bead of the quantum dots or the dye may be from about 50 nm to about 20 µm, from about 50 nm to about 10 µm, from about 50 nm to about 1 µm, from about 50 nm to about 500 nm, from about 50 nm to about 100 nm, from about 100 nm to about 20 µm, from about 500 nm to about 20 µm, from about 1 µm to about 20 µm, or from about 10 µm to about 20 µm, but may not be limited thereto.

In an exemplary embodiment of the present disclosure, surfaces of the fibers or the beads of the quantum dots or the dye may be treated by ALD. A buffer layer may be formed between a fiber-encapsulation layer and a bead-encapsulation layer or between a fiber-encapsulation layer-encapsulation layer and a bead-encapsulation layer-encapsulation layer through additional coating of an organic layer on the fibers or the beads of the quantum dots or the dye coated with the metal oxide through the ALD. An organic layer formed as the buffer layer may supply a group with a hydrophilic surface such as an —OH functional group.

In an exemplary embodiment of the present disclosure, quantum dot particles vulnerable to heat and moisture penetration can be protected by performing the ALD to the fibers or the beads. Further, an encapsulation structure is formed as an inorganic-organic-inorganic pair by performing ALD to the inorganic layer and MLD to the organic layer, and, thus, it is possible to effectively secure the stability against heat and moisture penetration.

In an exemplary embodiment of the present disclosure, the metal oxide coated on the fibers or the beads of the quantum dots or the dye by the ALD may include an inorganic material selected from the group consisting of $Al_2O_3$, $SiO_2$, $ZnO$, $ZrO_2$, $TiO_2$, $HfO_2$, $Ta_2O_5$, and combinations thereof, but may not be limited thereto.

In an exemplary embodiment of the present disclosure, an organic material functioning as a buffer layer between a fiber-inorganic material or a bead-inorganic material of the ALD-treated quantum dots or dye may be coated by the ALD, and the organic material may include a member selected from the group consisting of vinyl alcohol, ethylene vinyl alcohol, methacrylate, poloxamer, polyether, polymethyl vinyl ether, polyepoxy succinic acid, polyethylene glycol, polythioether (e.g., polythiophene, poly(3,4-ethylenedioxythiophene)), polythiol, polyvinyl acid, polyvinyl phosphonic acid, polyvinyl sulfuric acid, polyamide (e.g., polyacrylamide), polyethyloxazoline, polyester, fumed silica, and combinations thereof, and preferably, the organic material may include may include ethylene glycol, polyether, polythiol, poly carbonyl, poly ether, poly ester, or polytrimethacrylate, but may not be limited thereto.

In an exemplary embodiment of the present disclosure, the quantum dots may include core-shell quantum dots, but may not be limited thereto.

In an exemplary embodiment of the present disclosure, a core material of the core-shell quantum dots may include a member selected from the group consisting of Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdSeZn, CdTe, $Cd_3P_2$, $Cd_3As_2$, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, $CuInS_2$, $CuInSe_2$, $Cu_2ZnSnSe_4$, $AgIn_5S_8$, $Si_3N_4$, $Ge_3N_4$, $Al_2O_3$, $(Al, Ga, In)_2(S, Se, Te)_3$, and combinations thereof and preferably may include CdSe, InP, CdTe, $AgIn_5S_8$, Si, or C, but may not be limited thereto.

In an exemplary embodiment of the present disclosure, a shell of the core-shell quantum dots may include a member selected from the group consisting of CdS, CdS/ZnS, ZnS, ZnS/ZnS, ZnCdS, CdS, ZnS, ZnS, ZnSe/ZnS, CdS/CdS, PbS, ZnS, $SiO_2$, and combinations thereof and preferably may include ZnS, CdS, ZnCdS, or $SiO_2$, but may not be limited thereto.

In an exemplary embodiment of the present disclosure, a ligand of the core-shell quantum dots may include a member selected from the group consisting of glassy polymer-based, silicone-based, carboxylic acid-based, dicarboxylic acid-based, polycarboxylic acid-based, acrylic acid-based, phosphonic acid-based, phosphonate-based, phosphine-based, phosphine oxide-based, sulfide-based, amine-based, epoxide-based, amide-based, amine-based ligands, and combinations thereof and preferably may include an amine-based or amide-based ligand, but may not be limited thereto.

In an exemplary embodiment of the present disclosure, the dye may include a member selected from the group consisting of rhodamine-based, coumarin-based, acridine-based, fluorescein-based, erythrosine-based, anthraquinone-based, arylmethane-based, AZO-based, diazonium-based, nitro-based, nitroso-based, phthalocyanine-based, quinone-imine-based, thiazole-based, safranin-based, xanthene-based dyes, and combinations thereof and preferably may include a rhodamine-based dye, but may not be limited thereto.

A fourth aspect of the present disclosure provides a light emitting diode including the large scale film according to the second aspect of the present disclosure, containing fibers or beads of quantum dots or a dye adhering onto an adhesive film.

In an exemplary embodiment of the present disclosure, the light emitting diode may include the large scale film of a single layer or multiple layers, but may not be limited thereto. For example, the light emitting diode may include a film of a single layer or multiple layers containing quantum dot fibers having a core-shell structure, quantum dot beads, quantum dot beads having a core-shell structure, dye fibers, or dye beads, and may include films identical to or different from each other, but may not be limited thereto.

In an exemplary embodiment of the present disclosure, the large scale film contains quantum dots or a dye, and the quantum dots or the dye is uniformly dispersed in the large scale film.

In an exemplary embodiment of the present disclosure, the large scale film can be applied to a light emitting diode (LED), an organic light emitting diode (OLED), a backlight unit, solar energy generation, marine operations, and a plant factory.

EXAMPLES

Hereinafter, examples of the present disclosure will be described in detail. However, the present disclosure may not be limited thereto.

Examples

Example 1: Preparation of Quantum Dot Bead Film and Application to Light Emitting Diode 1. Synthesis of CdSe@Zn1-XCdXS Multi-Shell Red Quantum Dot Prior to synthesis of red quantum dots, cation and anion precursors were prepared. Cadmium oleate [$Cd(OA)_2$] and zinc oleate [$Zn(OA)_2$] as cation precursors were obtained by dispersing 100 mmol of cadmium oxide (CdO) and zinc oxide (ZnO) in a mixture solution of 100 mL of oleic acid (OA) and 100 mL of 1-octadecene (ODE). Further, TOP+Se and TOP+S as anion precursors were obtained by dispersing 20 mmol of each selenium (Se) and sulfur (S) in 10 mL of tri-n-octylphosphine (TOP). 1 mmol CdO, 3 mmol myristic acid (MA), and 15 mL of ODE were put into a 3-neck distillation flask and heated to 300° C. to prepare $Cd(MA)_2$. After the heated solution became transparent, 0.25 mL of TOP+Se was quickly injected to form a CdSe core. After 3 minutes, 3 mL of $Zn(OA)_2$ was injected and then, 1 mmol 1-dodecanediol (DDT) was slowly injected for 1 minute to make a reaction for 30 minutes and thus prepare a Zn0.4Cd0.6S shell. Then, 2 mL of $Cd(OA)_2$ and 4 mL of $Zn(OA)_2$ were injected and then, 1.5 mL of TOP+S was slowly injected for 1 minute to make a reaction for 10 minutes and thus prepare a Zn0.5Cd0.5S shell. By repeatedly injecting the precursors as described above, the quantum dots having a multi-shell structure were obtained. In order to remove impurities from the synthesized quantum dots, centrifugation was performed 4 times with ethanol and toluene.

2. Synthesis of CdSe@ZnS/ZnS Multi-Shell Green Quantum Dot

Prior to synthesis of green quantum dots, cation and anion precursors were prepared. Zinc oleate [$Zn(OA)_2$] as a cation precursor was obtained by dispersing 2.86 mmol zinc acetate dihydrate in a mixture solution of 1 mL of oleic acid (OA) and 4 mL of 1-octadecene (ODE). Further, TOP+Se+S as an anion precursor was obtained by dispersing 5 mmol selenium (Se) and 5 mmol sulfur (S) in 5 mL of TOP. ODE+S was obtained by dispersing 1.6 mmol sulfur (S) in 2.4 mL of ODE. Then, 0.14 mmol cadmium acetate, 3.41 mmol zinc oxide (ZnO), and 7 mL of OA were put into a 3-neck distillation flask and heated to 150° C., and then, 15 mL of ODE was injected and injected to 310° C. Then, 2.0 mL of TOP+Se+S was injected into the heated solution to make a reaction for 10 minutes and thus prepare CdSe@ZnS core-shell quantum dots. The prepared ODE+S was injected, and after 12 minutes, Zn(OA)2 was injected. Then, TOP+S was slowly injected for 10 minutes to make a reaction for 20 minutes and thus prepare a ZnS shell and obtain quantum dots having a multi-shell structure. In order to remove impurities from the synthesized quantum dots, centrifugation was performed 4 times with ethanol and hexane.

3. Preparation of Quantum Dot Bead

In order to prepare quantum dot beads, a solution in which polymethylmethacrylate (PMMA) and chloroform were dispersed at a ratio of 1:9 was used as a solvent and mixed with the obtained quantum dots at a ratio of 9:1. The completely dispersed solution was used in an electrospinning device to prepare quantum dot beads. In this case, a voltage was 20 kV, a distance between a nozzle and a substrate was 10 cm, and a release rate for the solution through the nozzle was fixed to 1 mL/h. The prepared quantum dot beads had a size of about 10 μm. Red and green quantum dot beads were also prepared by the same method as described above.

FIG. 1 provides a FE-SEM image of red quantum dot beads and a TEM image (inset) of a single quantum dot bead formed by the preparation method according to Example 1.

4. Preparation of Quantum Dot Bead Film

In order to prepare a large scale red quantum dot bead film, the CdSe/ZnS quantum dots were used. Polyacrylic acid (PAA) was coated to about 4 μm on a PET substrate of 50 μm using a bar coater and then cured at a temperature of about 80° C. for about 3 minutes. Then, the red quantum dot beads were sprayed to about 10 μm on the coated PAA and a pressure of about 50 $g/cm^2$ was applied thereto to bond particles of the red quantum dot beads to the PAA, and the non-bonded red quantum dot bead particles were removed and the PAA was completely cured, and, thus, a single quantum dot bead film was obtained.

Figure 2:
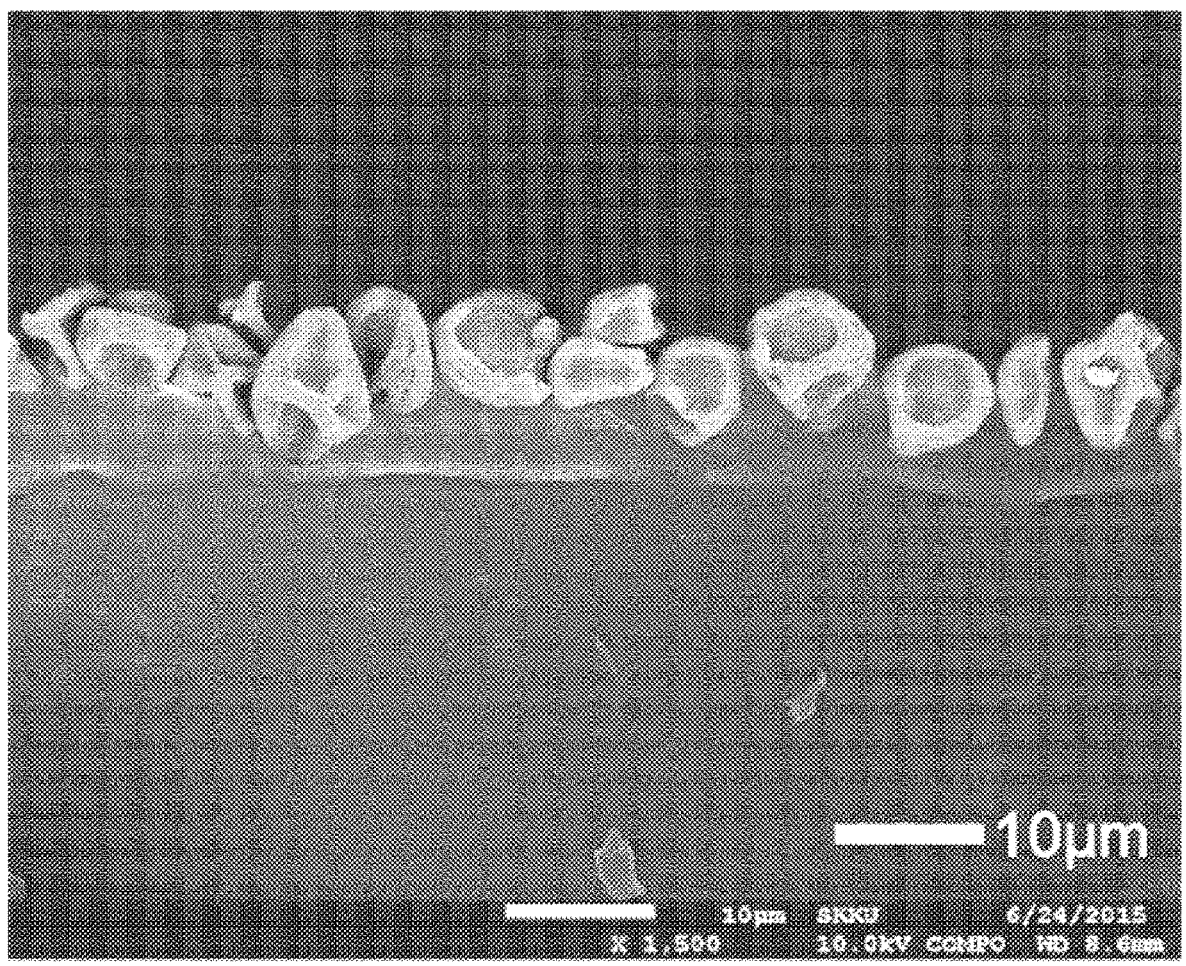
FIG. 2 is a FE-SEM image of a film prepared by coating PAA (poly-acrylic-acid) to about 4 μm on a PET substrate with a bar coater and coating red quantum dot beads in a single layer according to an example of the present disclosure.

FIG. 2 is a FE-SEM image of a film prepared by coating PAA (poly-acrylic-acid) to about 4 μm on a PET substrate with a bar coater and coating red quantum dot beads in a single layer according to an example of the present disclosure.

As Comparative Example 1 to be compared with the quantum dot beads of Example 1, quantum dot beads were prepared by mixing a solution in which chloroform was dispersed at a ratio of 1:9 with quantum dots at a ratio of 9:1 and pouring the mixture into an aluminum dish and then curing the mixture according to a conventional casting method. The quantum dots used in Comparative Example 1 were the red and green quantum dots prepared in Example 1.

Figure 3:
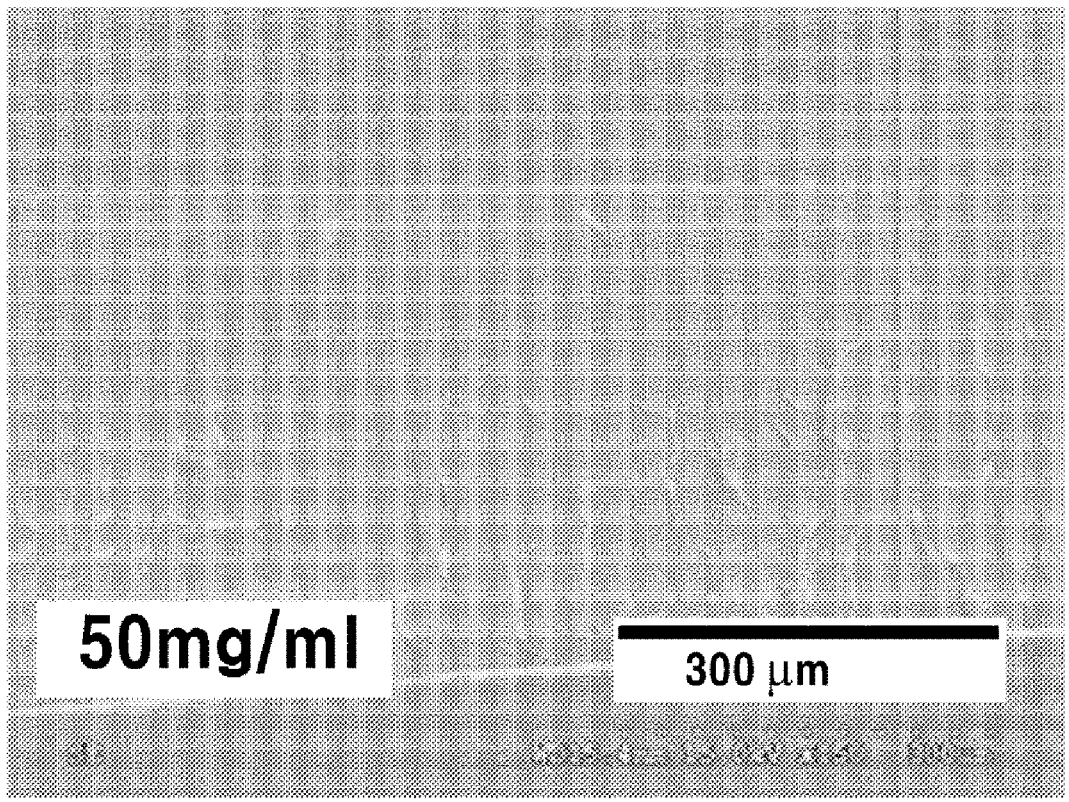
FIG. 3 is a FE-SEM image of a green quantum dot casting film according to Comparative Example 1 in an example of the present disclosure.
Figure 4:
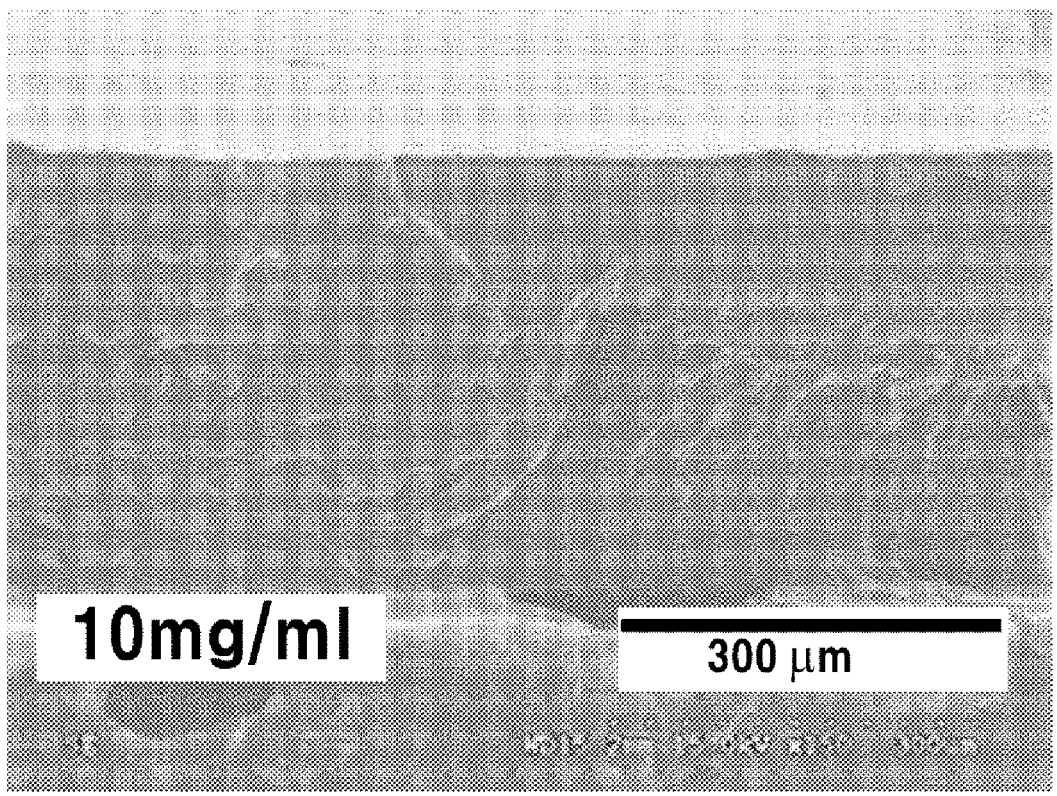
FIG. 4 is a FE-SEM image of a red quantum dot casting film according to Comparative Example 1 in an example of the present disclosure.

FIG. 3 and FIG. 4 are FE-SEM images of a green quantum dot casting film and a red quantum dot casting film, respectively, according to Comparative Example 1.

5. Evaluation on Uniformity of Large Scale Quantum Dot Bead Particle Layer

Green (CdSe@ZnCdS), yellow (CIS@ZnS), and red (CdSe@ZnCdS) quantum dot bead layers were coated to be films each having width of 15 cm or more by the same method as described in Example 1 (see "Preparation of quantum dot bead film"), and films obtained by cutting a green quantum dot bead layer (a), a yellow quantum dot bead layer (b), and a red quantum dot bead layer (c) into 9 pieces (marked from 1 to 9) were evaluated in terms of uniformity depending on area by performing a PL intensity test. The result of the test was as shown in FIG.5A to FIG. 5C.

Figure 5C:
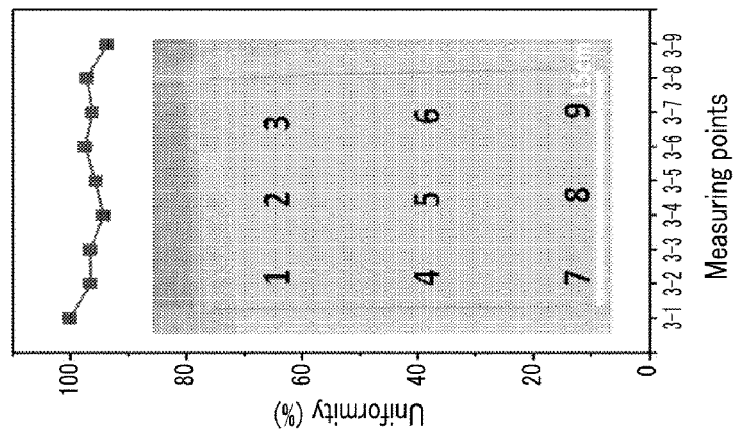
FIG. 5A to FIG. 5C show the uniformity which is evaluated by area of a film prepared by forming green (CdSe@ZnCdS), yellow (CIS@ZnS) and red (CdSe@ZnCdS) quantum dot layers, respectively, to the width of 15 cm or more according to an example of the present disclosure.
Figure 5B:
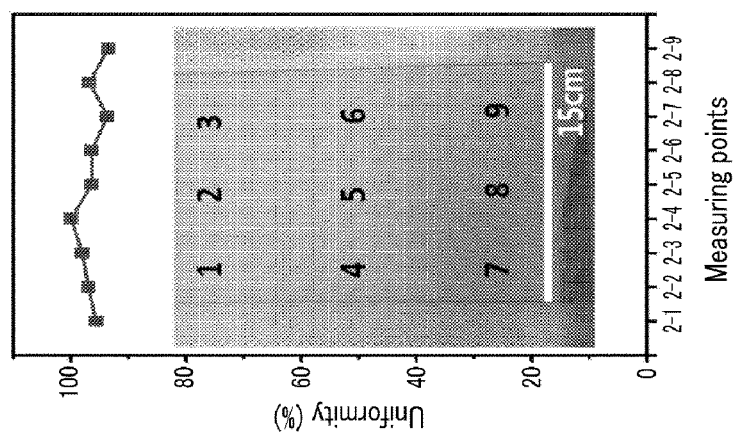
Figure 5A:
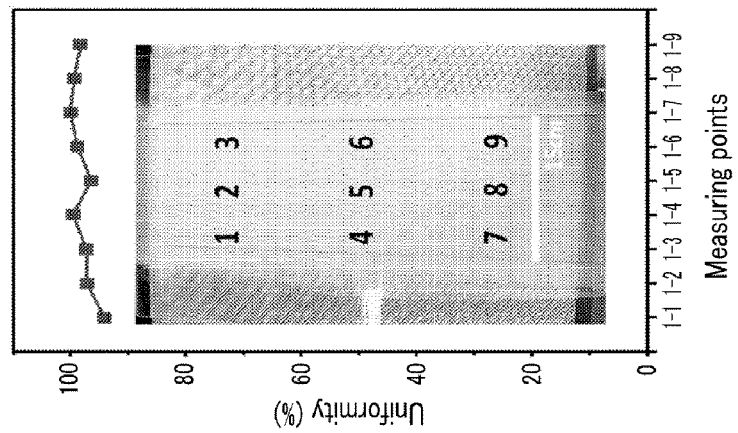

Referring to FIG. 5A to FIG. 5C, differences between the maximum values and the minimum values of PL intensity depending on area of the 9 pieces of the green quantum dot bead layer (a), the yellow quantum dot bead layer (b), and the red quantum dot bead layer (c) were 5.78%, 6.51%, and 6.27%, respectively, and the uniformities thereof were 94.22%, 93.49%, and 93.73%, respectively.

6. Preparation of Blue Light Source OLED (BOLED) Including Quantum Dot Bead Film A blue light source OLED (hereinafter, referred to as "BOLED") was deposited to a light emitting area of 50×50 mm² on a glass substrate of 50×50×1 mm³ by thermal chemical vapor deposition in 99.99% nitrogen atmosphere to form a structure of anode (ITO) 100 nm/HTL (NPB) 35 nm/EML (blue emitter) 30 nm/ETL (LiF) 1 nm/cathode (aluminum) 100 nm. An encapsulation process was performed to shield an organic layer and an aluminum metal electrode layer using a cover glass.

The obtained quantum dot bead layer was coated on the BOLED to prepare a BOLED including a quantum dot bead layer.

TABLE 1

| No. | CRI (%) | Lm/W (enhanced rate) | Nit | EQE (enhanced rate) | CIE (x, y) | Emission peak |
|---|---|---|---|---|---|---|
| BOLED | 0 | 3.63 (100%) | 246 | 3.29 (100%) | 0.15, 0.22 | 489 |
| BOLED a | 0 | 4.79 (132%) | 313 | 4.22 (128%) | 0.18, 0.25 | 642 |
| BOLED b | 0 | 4.32 (119%) | 289 | 4.03 (122%) | 0.24, 0.29 | 642 |
| BOLED c | 67 | 4.41 (122%) | 294 | 3.63 (110%) | 0.34, 0.40 | 642 |

The Table 1 shows the measured values of CRI, Lm/W, Nit, EQE, and CIE coordinates of samples coated with quantum dot bead layers prepared by coating a red quantum dot bead single layer (BOLED a), a red quantum dot double layer (BOLED b), and a red quantum dot bead double layer coated with a YAG:Ce fluorescent body single layer (BOLED c) on the BOLED. The BOLED a, BOLED b, and BOLED c refer to the red quantum dot bead single layer [a: RQD bead(1)], the red quantum dot double layer [b: RQD bead(2)], and the red quantum dot bead double layer coated with the YAG:Ce fluorescent body single layer [c: YAG:Ce (1)/RQD bead(2)], respectively, on the BOLED.

As shown in the Table 1, the EQE of the BOLED was measured as 3.29%, and it was confirmed that the EQE of the BOLED a and the BOLED b were increased to 4.22% and 4.03%, respectively since 28% and 22% of photons of the BOLED were additionally extracted. This confirms that the quantum dot bead layers obtained by electrospinning have an effect of light extraction of the BOLED. Further, it was confirmed that as the number of quantum dot bead layers was increased, light extraction was decreased. It is considered that the quantum dot beads lead to loss of photons of the BOLED. It was confirmed that BOLED c showed a white light with CRI of 67.

Figure 6:
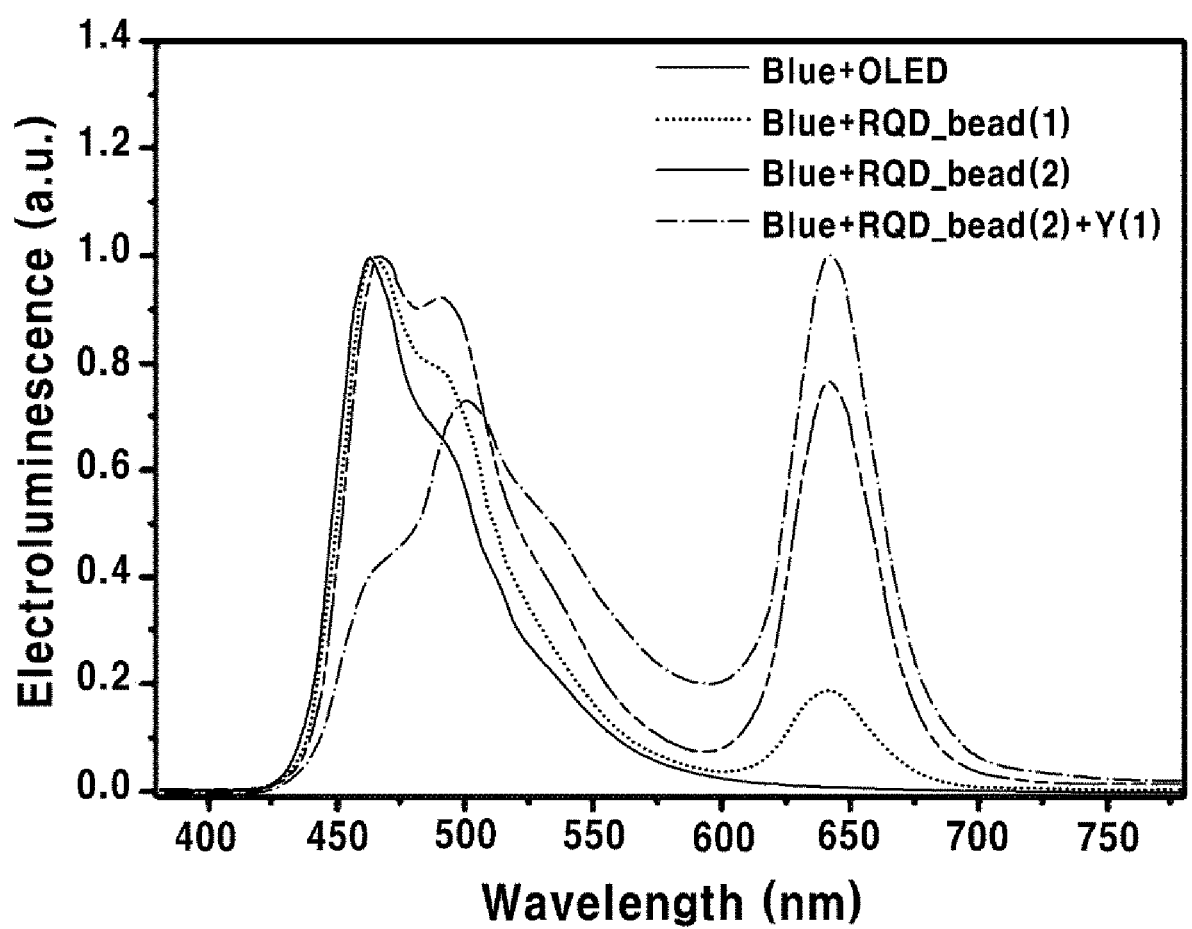
FIG. 6 is a graph obtained by coating a red quantum dot bead single layer (a), a red quantum dot bead double layer (b) and a red quantum dot bead double layer/YAG:Ce fluorescent body single layer (c) on a BOLED and analyzing them according to wavelength with an electroluminescent spectrometer in an example of the present disclosure.

FIG. 6 is a graph obtained by analyzing a BOLED including a quantum dot bead film prepared by coating a red quantum dot bead single layer (a), a red quantum dot bead double layer (b) and a red quantum dot bead double layer/YAG:Ce fluorescent body single layer (c) on the BOLED according to wavelength with an electroluminescent spectrometer.

6. Preparation of Blue Light Source LED (BLED) Including Quantum Dot Bead Film

A BLED including a quantum dot bead layer was prepared by coating each of the quantum dot bead layers of various colors prepared by the same method as described in Example 1 on a blue light source LED (hereinafter, referred to as "BLED").

TABLE 2

| No. | Lm/W (enhanced rate) | EQE (enhanced rate) | Absolute quantum efficiency (%) |
|---|---|---|---|
| BLED | 19.2 | 50 | — |
| BLED_b | 24.5 (147%) | 43.8 | 87 |
| BLED_d | 77.8 (405%) | 46.2 | 92 |
| BLED_e | 21.5 (112%) | 51.8 | — |
| BLED_f | 35.0 (182%) | 32.1 | 64 |
| BLED_g | 20.2 (105%) | 13.0 | 26 |

The Table 2 shows the measured values of Lm/W, EQE, and absolute quantum efficiency obtained after coating a red quantum dot bead layer (b), a green quantum dot bead double layer (d), and a white bead double layer (e) according to Example 1 and a green quantum dot casting film (f) and a red quantum dot casting film (g) according to Comparative Example 1 on the BLED.

As shown in the Table 2, the EQE of the LED was measured as 50%, and it was confirmed that the EQE of the BLED b, the BLED d, the BLED e, the BLED f, and the BLED g were 43.8%, 46.2%, 51.8%, 32.1%, and 13.0%, respectively, which were 88%, 92%, 104%, 64%, and 26% of the EQE of the BOLED. The BOLED e was used on the LED and showed extraction of 4% of photons confined in the LED. Particularly, the quantum efficiencies of the quantum dot films b, d, f, and g were 87%, 92%, 64%, and 26%, respectively. The quantum dot bead layer films had much higher quantum efficiencies than the quantum dot casting films. Further, it was confirmed that the sample d prepared by coating the green quantum dot bead double layer on the BLED was improved in Lm/W by 405% compared with that of the BLED.

Figure 7:
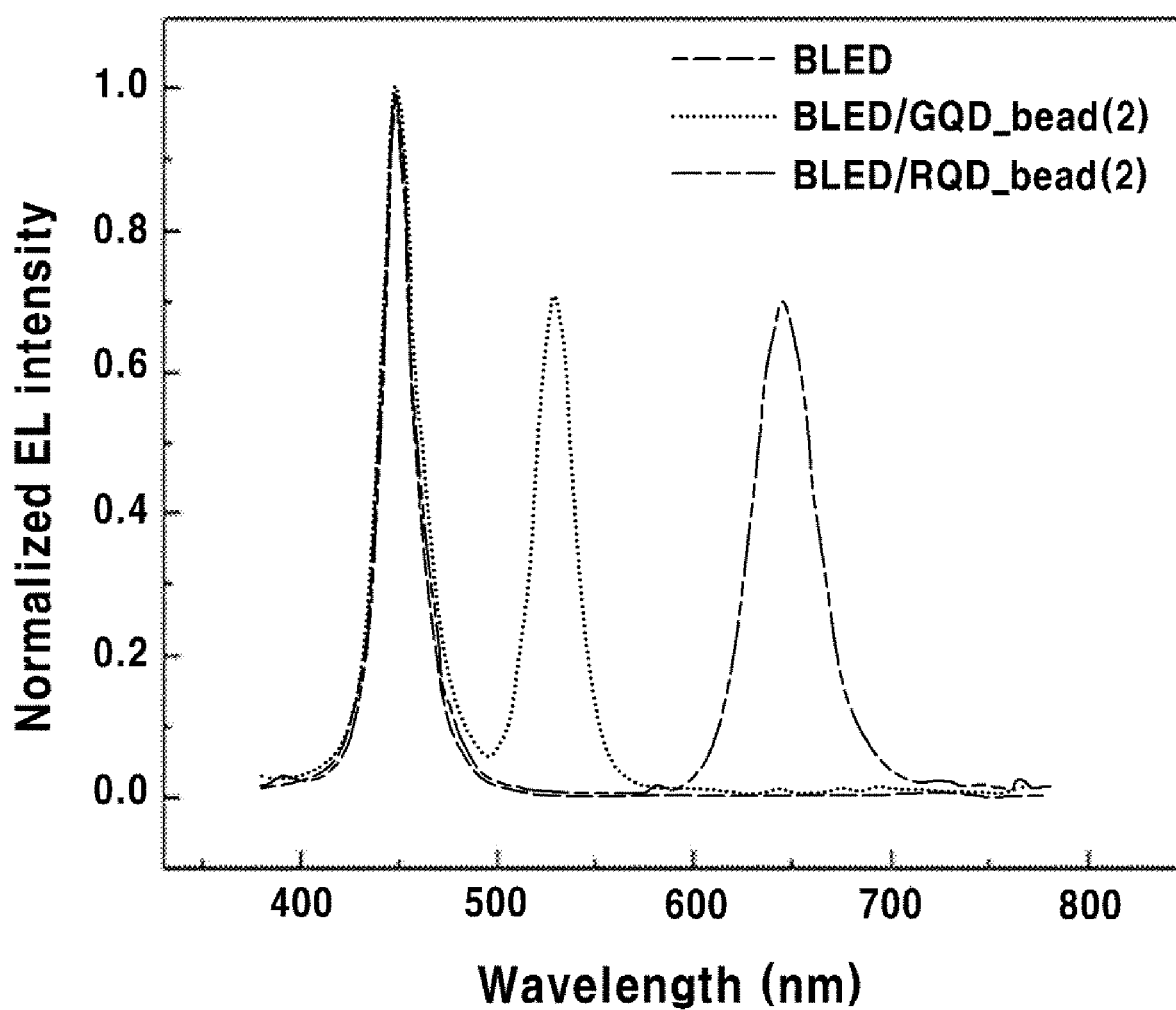
FIG. 7 is a graph obtained by coating a red quantum dot bead double layer/BLED (a) and a green quantum dot bead double layer/BLED (b) on a BLED and analyzing measured normalized EL intensities according to wavelength in an example of the present disclosure.

FIG. 7 is a graph obtained by coating a red quantum dot bead double layer/BLED (a) and a green quantum dot bead double layer/BLED (b) on a BLED and analyzing measured normalized EL intensities according to wavelength.

Example 2: Preparation of Quantum Dot Nanofiber Film and Application to Light Emitting Diode 1. Synthesis of CIS@ZnS Quantum Dot In order to form a CIS core, 0.05 mmol copper iodide (CuI), 1 mmol indium acetylacetonate [In(Ac)$_3$], and 10 mL of 1-dodecanediol (DDT) were put into a 3-neck distillation flask, and water and oxygen were removed for 20 minutes. Then, 10 mL of 1-octadecene (ODE) was injected and reacted at 200° C. for 30 minutes. In order to form a shell, zinc acetate (2, 4, 6 or 8 mmol) was put into a mixture solution of 8 mL of ODE and 4 mL of OA in a 3-neck distillation flask and dispersed therein at 120° C. The shell solution was injected to the prepared core solution at a rate of 1.0 mL/min to obtain CIS@ZnS core-shell quantum dots.

2. Preparation of Quantum Dot Nanofiber

In order to prepare quantum dot nanofibers, a solution in which polystyrene and chloroform were dispersed at a ratio of 1:9 was used as a solvent and mixed with the obtained quantum dots at a ratio of 9:1. The completely mixed solution was used in an electrospinning device to prepare quantum dot nanofibers. In this case, a voltage was 10 kV, a distance between a nozzle and a substrate was 10 cm, and a release rate for the quantum dot-polystyrene solution through the nozzle was fixed to 20 µL/min. In this way, CIS@ZnS quantum dot nanofibers were prepared.

3. Preparation of Quantum Dot Nanofiber Film

In order to prepare a large scale red quantum dot nanofiber film, PAA (polyacrylic acid) was coated to about 4 µm on a PET substrate of 50 µm using a bar coater and then cured at a temperature of about 80° C. for about 3 minutes. Then, the CIS@ZnS quantum dot nanofibers were sprayed to about 10 µm on the coated PAA and a pressure of about 50 g/cm$^2$ was applied thereto to bond particles of the CIS@ZnS quantum dot nanofibers to the PAA, and the non-bonded CIS@ZnS quantum dot nanofiber particles were removed and the PAA was completely cured, and, thus, a single quantum dot nanofiber film was obtained.

As Comparative Example 2 to be compared with the quantum dot nanofibers of Example 2, quantum dot nanofibers were prepared by mixing a solution in which chloroform was dispersed at a ratio of 1:9 with quantum dots at a ratio of 9:1 and pouring the mixture into an aluminum dish and then curing the mixture according to the conventional casting method. The quantum dots used in Comparative Example 2 were the quantum dots prepared in Example 2.

Figures 8A, 8B:
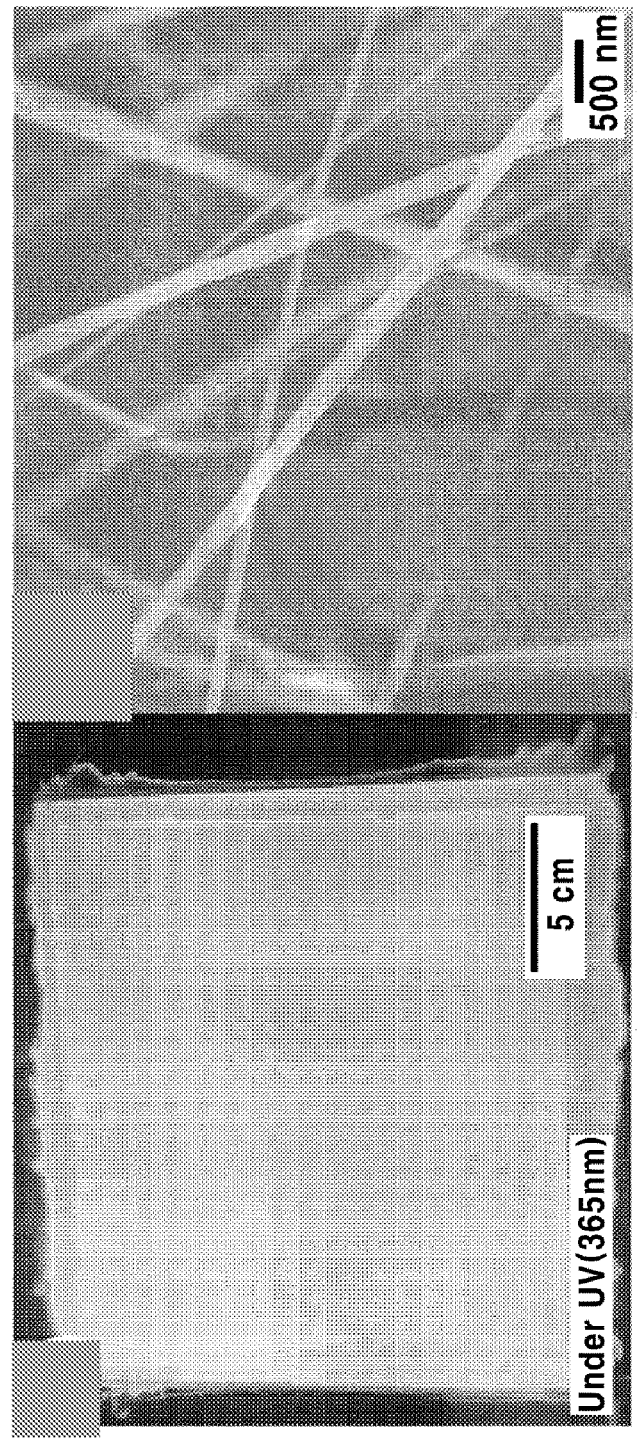
FIG. 8A and FIG. 8B provide an image of a quantum dot nanofiber film when observed under UV having a wavelength of 365 nm and a FE-SEM image of quantum dot nanofibers, respectively, in an example of the present disclosure.

FIG. 8A is an image of a quantum dot nanofiber film having a size of 20 cm×20 cm according to Example 2 when observed under UV having a wavelength of 365 nm and it was confirmed that the quantum dot nanofiber film emitted a red-orange light, and FIG. 8B is a FE-SEM image of quantum dot nanofibers prepared according to Example 2 and it was confirmed that the quantum dot nanofiber had a uniform diameter.

Figure 9A:
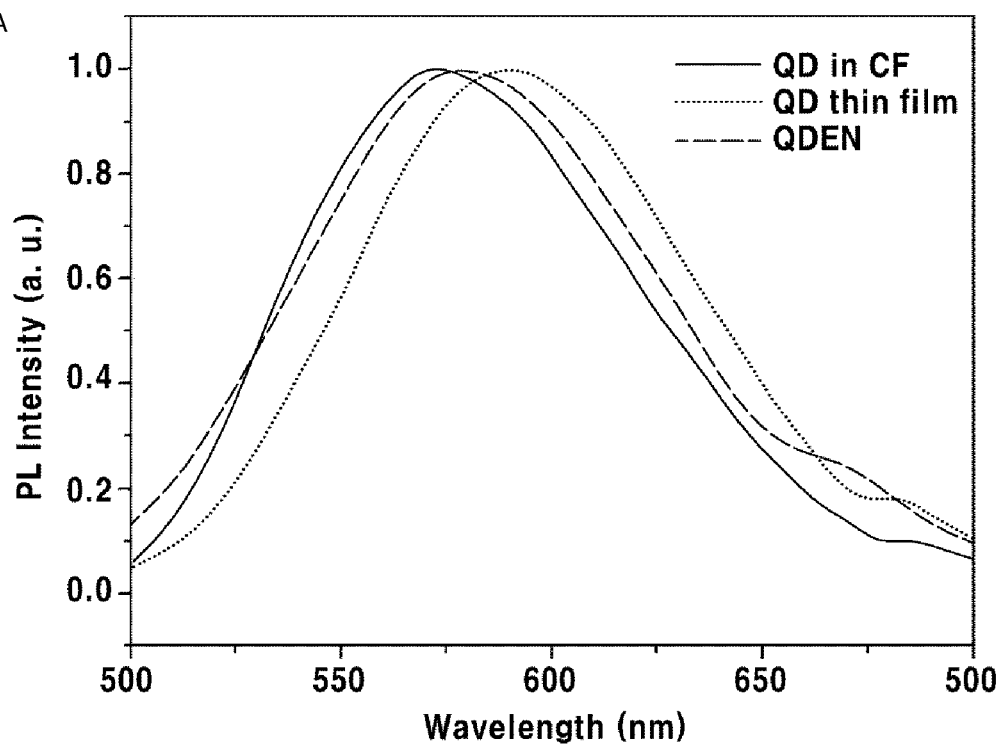
FIG. 9A compares a PL property among a quantum dot solution, a quantum dot casting film (Comparative Example 2), and a quantum dot nanofiber film according to Example 2 in an example of the present disclosure.

FIG. 9A compares a PL property among a quantum dot solution QDEN, a quantum dot casting film QD in CF (Comparative Example 2), and a quantum dot nanofiber film QD thin film according to Example 2.

As shown in FIG. 9A, the emission peak of the quantum dot solution QDEN was 573.5 nm, the emission peak of the quantum dot nanofiber film QD thin film was 579.5 nm, and the emission peak of the quantum dot casting film QD in CF was 590 nm. It was confirmed that the emission peaks of the quantum dot casting film QD in CF and the quantum dot nanofibers were shifted to a red region as compared with the emission peak of the quantum dot solution QDEN. The shift of emission peak is considered as a result of agglomeration of quantum dots.

4. Preparation of White LED Including Quantum Dot Nanofiber Film

A white LED was prepared by coating a quantum dot nanofiber film on a GaN blue LED having a size of 5×5 mm$^2$.

Figure 10:
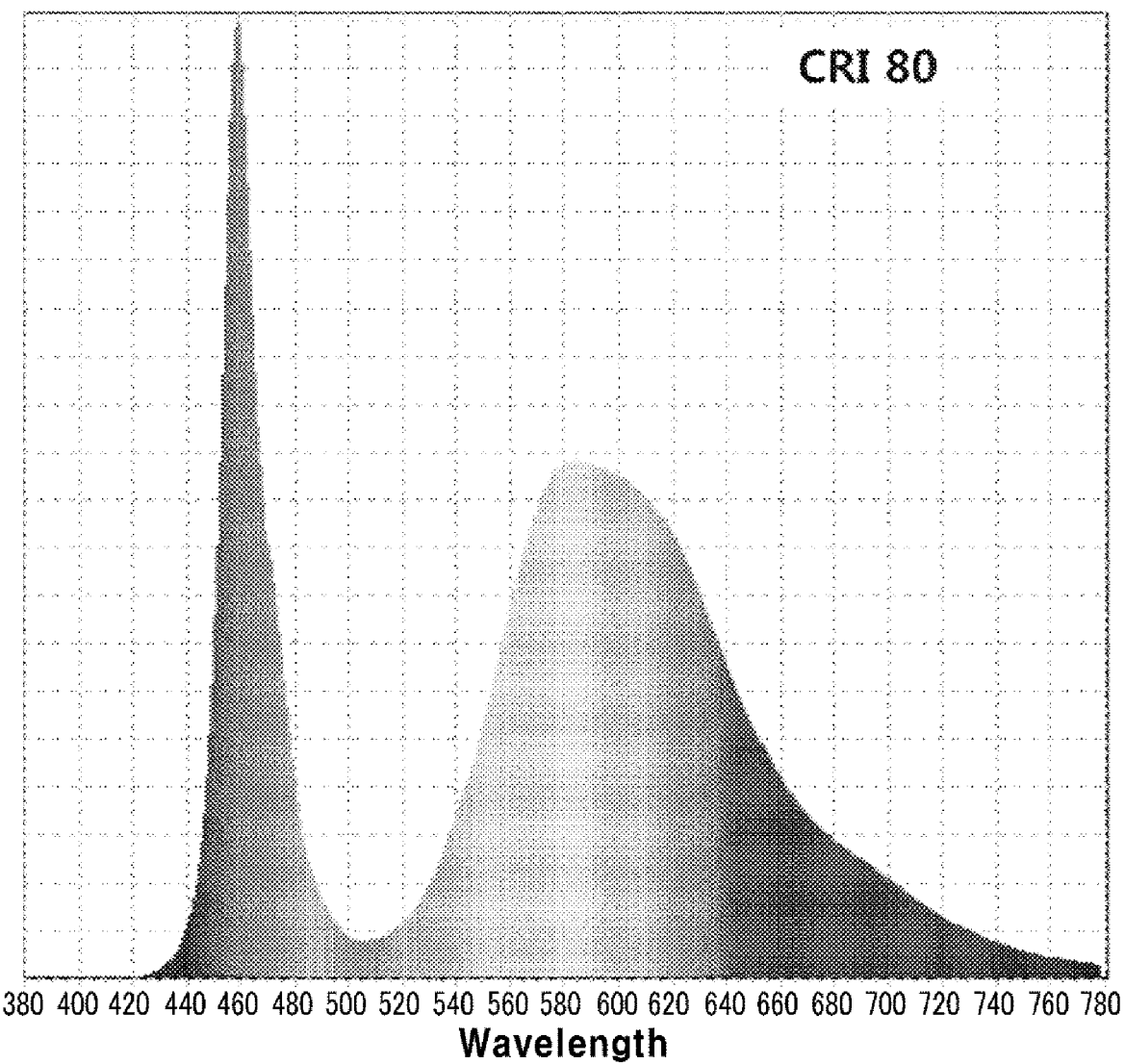
FIG. 10 shows a white light spectrum measured after a ground CIS quantum dot nanofiber single layer is coated on a BLED in an example of the present disclosure.

FIG. 10 shows a white light spectrum measured after a ground CIS quantum dot nanofiber single layer is coated on a BLED.

Figure 9B:
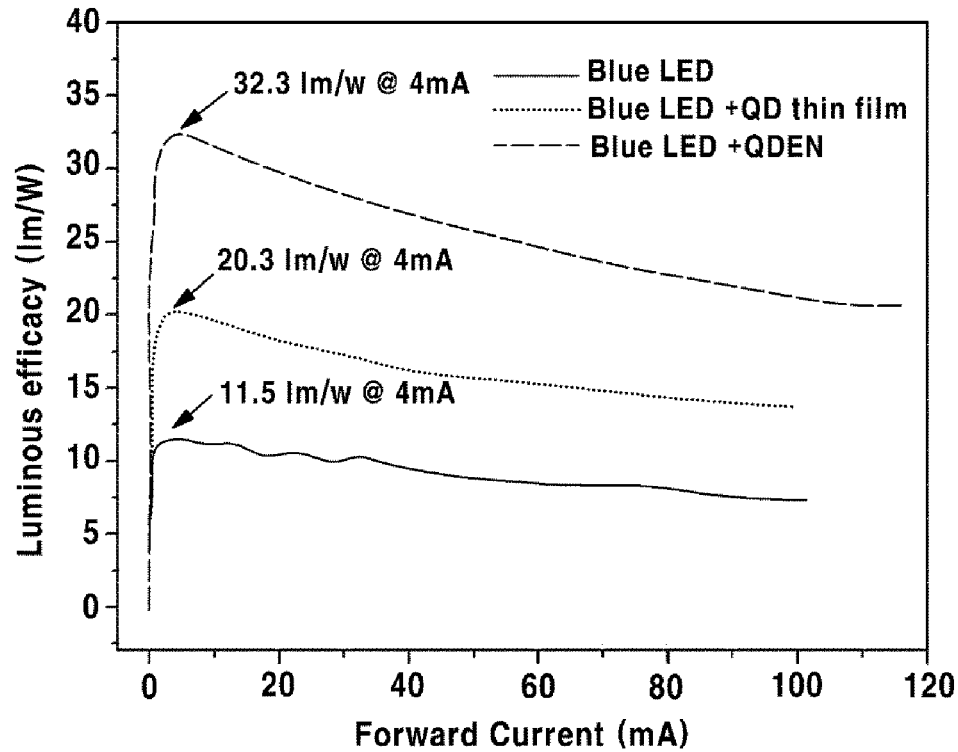
FIG. 9B shows the efficiency of a white LED obtained by using a quantum dot casting film or a quantum dot nanofiber film as a color conversion film on a GaN blue LED in an example of the present disclosure.

FIG. 9B shows the efficiency of a white LED obtained by using a quantum dot casting film QD in CF or a quantum dot nanofiber film QD thin film as a color conversion film on a GaN blue LED.

As shown in FIG. 9B, at 4 mA, the blue LED showed a luminous efficacy of 11.5 lm/W, the white LED obtained by using the quantum dot casting film QD in CF showed a luminous efficacy of 20.3 lm/W, and the white LED obtained by using the quantum dot nanofiber film QD thin film showed a luminous efficacy of 32.3 lm/W. It is considered that effective light extraction through the quantum dot nanofiber film QD thin film results from PL quenching caused by agglomeration of quantum dots in the quantum dot casting film QD in CF and insufficient light dispersion caused by quantum dots uniformly dispersed in the quantum dot nanofibers.

Example 3: Preparation of Rhodamine Bead Film and Application to Light Emitting Diode 1. Preparation of Rhodamine Bead A rhodamine bead film was prepared using rhodamine 640 and rhodamine 6G among rhodamines as a dye. A solution in which PMMA and chloroform were dispersed at a ratio of 1:9 was used as a solvent and mixed with the obtained rhodamine at a ratio of 10:1. The completely dispersed solution was used in an electrospinning device to prepare rhodamine beads. In this case, a voltage was 20 kV, a distance between a nozzle and a substrate was 10 cm, and a release rate for the solution through the nozzle was fixed to 1 mL/h. The prepared rhodamine beads had a size of about 10 µm. Red and orange rhodamine beads were also prepared by the same method as described above.

2. Preparation of Rhodamine Bead Film

In order to prepare a large scale rhodamine bead film, the obtained red and orange rhodamine beads were used. PAA (polyacrylic acid) was coated to about 4 µm on a PET substrate of 50 µm using a bar coater and then cured at a temperature of about 80° C. for about 3 minutes. Then, the rhodamine beads were sprayed to about 10 µm on the coated PAA and a pressure of about 50 g/cm$^2$ was applied thereto to bond particles of the rhodamine beads to the PAA, and the non-bonded rhodamine bead particles were removed and the PAA was completely cured, and, thus, a single rhodamine bead film was obtained.

3. Preparation of Green Light Source OLED (GOLED) Including Rhodamine Bead Film

A green light source OLED (hereinafter, referred to as "GOLED") was deposited by thermal chemical vapor deposition in 99.99% nitrogen atmosphere to form a structure of anode (ITO) 100 nm/HTL (NPB) 40 nm/EML (green emitter) 50 nm/EIL(Liq) 1.5 nm/cathode (aluminum) 100 nm. An encapsulation process was performed to shield an organic layer and an aluminum metal electrode layer using a cover glass.

The obtained rhodamine bead film was coated on the GOLED to prepare a GOLED including a rhodamine bead film.

Figure 11A:
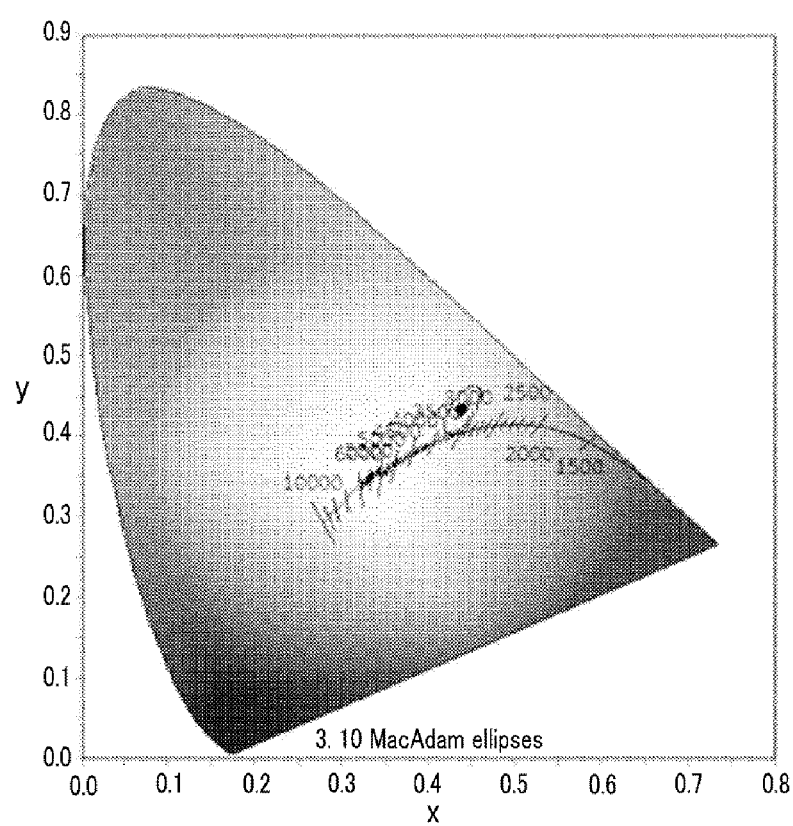
FIG. 11A and FIG. 11B provide a graph showing color coordinates and CRI and a spectrum measured after a Rhodamine 640/Rhodamine 6G bead double layer is coated on a GOLED, respectively, in an example of the present disclosure.
Figure 11B:
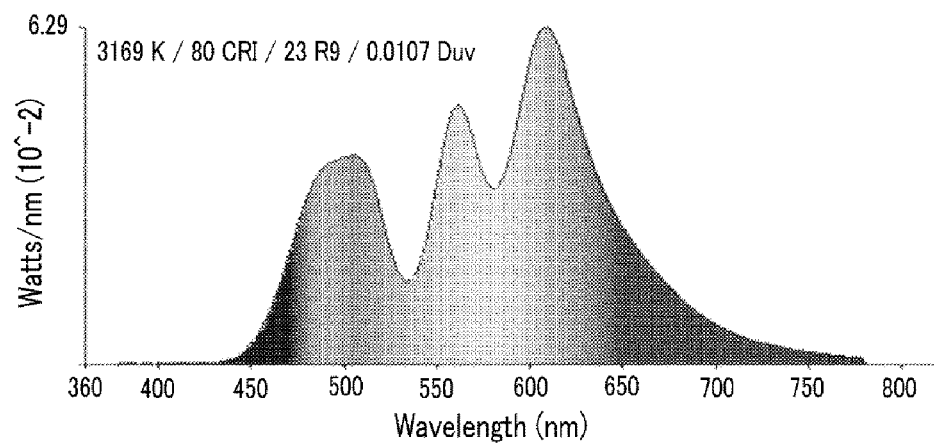

FIG. 11A and FIG. 11B provide a graph showing color coordinates and CRI and a spectrum measured after a Rhodamine 640/Rhodamine 6G bead double layer is coated on a GOLED, respectively.

4. Preparation of White LED Including Rhodamine Bead Film

A white OLED was obtained by coating a rhodamine 640/rhodamine 6G bead double layer on the green OLED. The color coordinates for the rhodamine 640/rhodamine 6G bead double layer obtained a white light at about 3,200 K. Further, due to the use of the rhodamine 640 and the rhodamine 6G, a white light spectrum reaching a CRI of 80 could be observed through EL analysis.

Example 4: ALD Encapsulation of Quantum Dot Bead

The quantum dot beads are very vulnerable to moisture penetration, and, thus, the quantum dot beads can be protected against heat and moisture by ALD surface coating.

A 500 mL-ALD reactor was filled with 10 g of the quantum dot beads obtained in Example 1. A reaction was carried out by applying boost of $N_2$ at 250 sccm during an $Al_2O_3$ precursor pulse under the whole pulsing condition. The $N_2$ was used as a carrier gas and a purging gas between exposures of a reactant. The reactor was heated to 80° C. before a trimethyl aluminum (TMA) precursor was injected into a reaction chamber.

First step: Inject TMA for 2 seconds, and inject TMA for 5 seconds for stirring of beads, and perform 100 sccm-$N_2$ purge to all of the precursors except 250 sccm-$N_2$ pulse Second step: Perform $N_2$ purge for 10 seconds Repeat the first step and the second step once more.

Third step: Perform $N_2$ purge for 300 seconds

Fourth step: Perform 100 sccm-$N_2$ purge to all of the precursors except 250 sccm-$N_2$ pulse of ethylene glycol for 2 seconds Repeat the third step and the fourth step once more.

Figure 12:
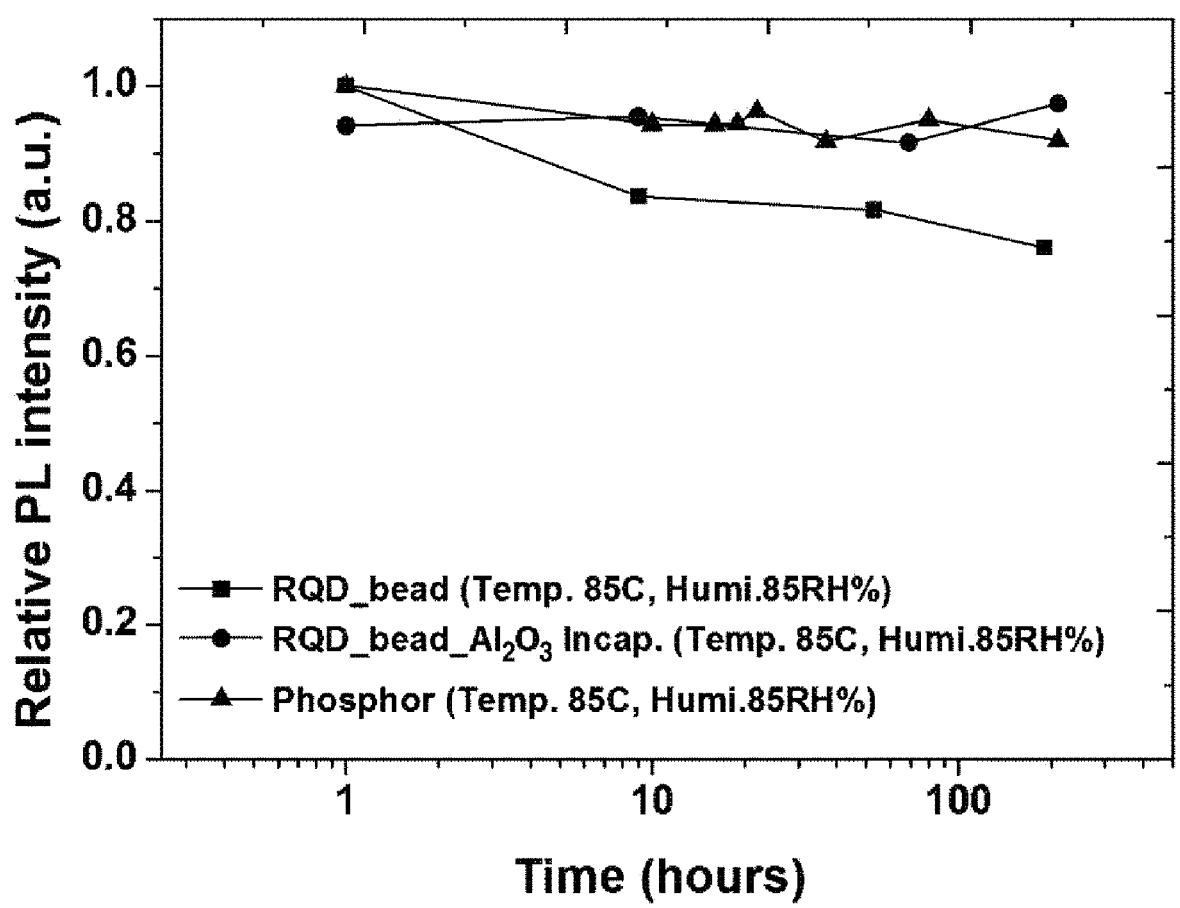
FIG. 12 is a graph showing a change in relative PL intensity of quantum dot beads, quantum dot beads encapsulated with $Al_2O_3$ by ALD, and a YAG:Ce fluorescent body in an example of the present disclosure.

Obtain quantum beads with an encapsulation structure of $Al_2O_3$/organic material/$Al_2O_3$ by repeating the first step and the second step once more FIG. 12 is a graph showing a change in relative PL intensity of quantum dot beads, quantum dot beads encapsulated with $Al_2O_3$ by ALD, and a YAG:Ce fluorescent body under atmosphere of 85° C./85 RH % according to processing time.

As shown in FIG. 12, the quantum dot beads encapsulated with $Al_2O_3$ by ALD had a higher stability against heat and moisture than the non-encapsulated quantum dot beads. Further, the quantum dot beads encapsulated with $Al_2O_3$ under atmosphere of 85° C./85 RH % after 200 hours and the quantum dot beads showed relative intensities of 88.4% and 69.1%, respectively. The values of the quantum dot beads encapsulated with $Al_2O_3$ and the quantum dot beads were not much different from the YAG:Ce fluorescent body which showed 83.6% under atmosphere of 85° C./85 RH % after 200 hours.

It was confirmed that the stability of quantum dot beads against heat and moisture can be increased by encapsulation with $Al_2O_3$ by the ALD.

Figure 13:
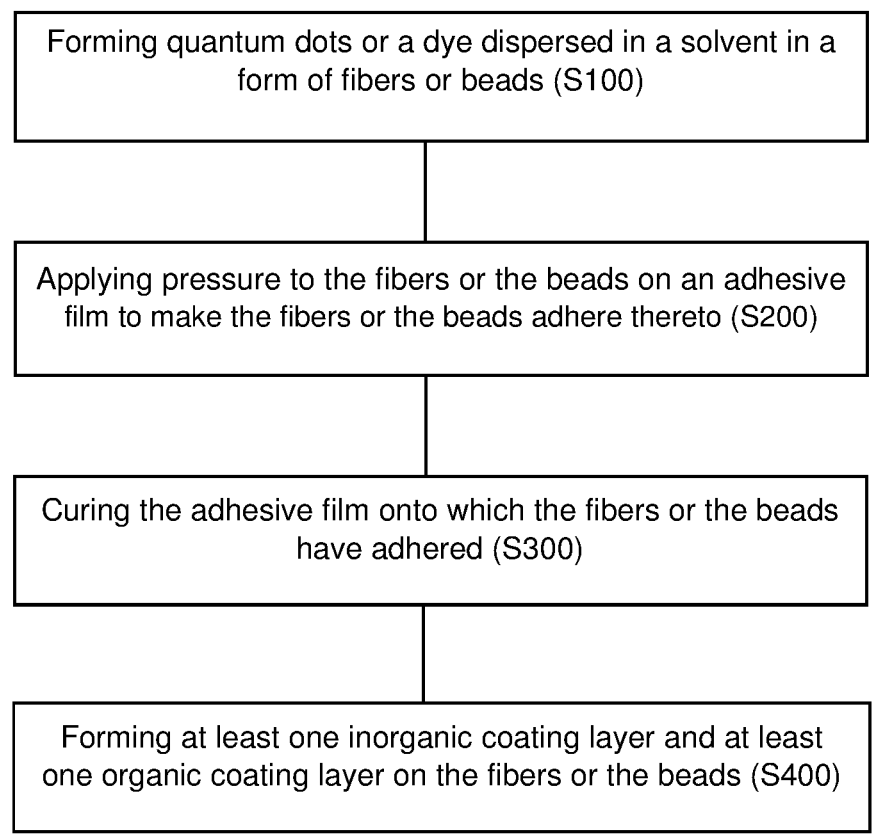
FIG. 13 is a flow chart showing a method for preparing a large scale film in an example of the present disclosure.

FIG. 13 is a flow chart showing a method for preparing a large scale film according to an embodiment of the present disclosure. In an exemplary embodiment, the method comprises forming quantum dots or a dye dispersed in a solvent in a form of fibers or beads (S100); applying pressure to the fibers or the beads on an adhesive film to make the fibers or the beads adhere thereto (S200); curing the adhesive film onto which the fibers or the beads have adhered (S300); and forming at least one inorganic coating layer and at least one organic coating layer on the fibers or the beads (S400).

The above description of the present disclosure is provided for the purpose of illustration, and it would be understood by those skilled in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description. It shall be understood that all modifications and embodiments conceived from the meaning and scope of the claims and their equivalents are included in the scope of the present disclosure.

We claim:

1. A method of preparing a large scale film, the method comprising:

electrospinning a mixture comprising a polymer matrix and quantum dots or dyes dispersed in a solvent through a nozzle of a electrospinning device onto an intermediate substrate of the electrospinning device and solidifying the mixture such that solidified fibers or beads of the quantum dots or dyes are formed on the intermediate substrate;

spraying the solidified fibers or beads of the quantum dots or dyes on an adhesive film and applying a predetermined pressure onto the solidified fibers or beads of the quantum dots or dyes to make the solidified fibers or beads of the quantum dots or dyes adhere to the adhesive film;

curing the adhesive film onto which the solidified fibers or beads of the quantum dots or dyes have adhered; and forming at least one inorganic coating layer and at least one organic coating layer on the solidified fibers or beads of the quantum dots or dyes, wherein the adhesive film comprises a member selected from a group consisting of optically clear adhesive (OCA), optically clear resin (OCR), polyimide, polyethylene terephthalate, polycarbonate, silicone, and combinations thereof.

2. The method of preparing a large scale film of claim 1, wherein the forming of the at least one inorganic coating layer is performed by an atomic layer deposition (ALD), and the forming of the at least one organic coating layer is performed by a molecular layer deposition (MLD).

3. The method of preparing a large scale film of claim 1, wherein the solidified fibers or the beads of the quantum dots or dyes include quantum dot fibers, quantum dot fibers having a core-shell structure, quantum dot beads, quantum dot beads having a core-shell structure, dye fibers, or dye beads.

4. The method of preparing a large scale film of claim 3, wherein a width of the solidified fiber or an average size of the solidified beads is from 50 nm to 20 μm.

5. The method of preparing a large scale film of claim 1, wherein the solvent includes an organic solvent in which the polymer is dispersed.

6. The method of preparing a large scale film of claim 1, further comprising gathering the solidified fibers or beads of the quantum dots or dyes from the substrate after the electrospinning.

7. The method of preparing a large scale film of claim 1, wherein a voltage for the electrospinning is 20 kV and a release rate of the mixture is 1 mL/h.

8. A method for preparing a large scale film, the method comprising:

electrospinning a mixture comprising a polymer matrix and quantum dots or dyes dispersed in a solvent through a nozzle of a electrospinning device onto an intermediate substrate of the electrospinning device and solidifying the mixture such that solidified fibers or beads of the quantum dots or dyes are formed on the substrate;

spraying the solidified fibers or beads of the quantum dots or dyes on an adhesive film and applying a predetermined pressure onto the solidified fibers or beads of the quantum dots or dyes to make the solidified fibers or the beads of the quantum dots or dyes adhere to the adhesive film, the adhesive film comprising optically clear adhesive (OCA) or optically clear resin (OCR); and forming at least one inorganic coating layer and at least one organic coating layer on the solidified fibers or beads, wherein the forming of the at least one organic coating layer is performed by a molecular layer deposition (MLD).

9. The method of claim 8, wherein the solidified fibers or beads of the quantum dots or dyes include quantum dot fibers, quantum dot fibers having a core-shell structure, quantum dot beads, quantum dot beads having a core-shell structure, dye fibers, or dye beads.

10. The method of claim 8, wherein a width of the solidified fiber or an average size of the solidified beads is from 50 nm to 20 µm.

11. The method of claim 8,
wherein the forming of the at least one inorganic coating layer is performed by an atomic layer deposition (ALD).

12. The method of preparing a large scale film of claim 8, further comprising gathering the solidified fibers or beads of the quantum dots or dyes from the substrate after the electrospinning.

13. The method of preparing a large scale film of claim 1, wherein a voltage for the electrospinning is 10 kV and a release rate of the mixture is 20 µL/h.

14. A method of preparing a large scale film, the method comprising:
electrospinning a mixture comprising a polymer matrix and quantum dots or dyes dispersed in a solvent through a nozzle of a electrospinning device onto an intermediate substrate of the electrospinning device and solidifying the mixture such that solidified fibers or beads of the quantum dots or dyes are formed on the substrate;
forming an adhesive film;
spraying the solidified fibers or beads of the quantum dots or dyes on the adhesive film and applying a predetermined pressure onto the solidified fibers or beads of the quantum dots or dyes to make the solidified fibers or beads of the quantum dots or dyes adhere to the adhesive film;
removing rest of the solidified fibers or beads which are non-adhered to the adhesive film; and
curing the adhesive film onto which at least a portion of the solidified fibers or beads are adhered.

15. The method of preparing a large scale film of claim 14, further comprising:
after the forming of the solidified fibers or beads of the quantum dots or dyes, forming at least one inorganic coating layer and at least one organic coating layer on each of the solidified fibers or beads of the quantum dots or dyes,
wherein the forming of the at least one inorganic coating layer is performed by an atomic layer deposition (ALD), and the forming of the at least one organic coating layer is performed by a molecular layer deposition (MLD).

16. The method of preparing a large scale film of claim 14, wherein the solidified fibers or beads of the quantum dots or dyes include quantum dot fibers, quantum dot fibers having a core-shell structure, quantum dot beads, quantum dot beads having a core-shell structure, dye fibers, or dye beads.

17. The method of preparing a large scale film of claim 16, wherein a width of the solidified fiber or a size of the solidified bead is from 50 nm to 20 µm.

18. The method of preparing a large scale film of claim 14, further comprising gathering the solidified fibers or beads of the quantum dots or dyes from the substrate after the electrospinning.

* * * * *